(12) United States Patent
Cho et al.

(10) Patent No.: US 8,003,993 B2
(45) Date of Patent: Aug. 23, 2011

(54) LIGHT EMITTING DEVICE HAVING LIGHT EXTRACTION STRUCTURE

(75) Inventors: Hyun Kyong Cho, Seoul (KR); Sun Kyung Kim, Gyeonggi-do (KR); Jun Ho Jang, Gyeonggi-do (KR)

(73) Assignees: LG Innotek Co., Ltd., Seoul (KR); LG Electronics Inc., Seoul (KR)

( * ) Notice: Subject to any disclaimer, the term of this patent is extended or adjusted under 35 U.S.C. 154(b) by 0 days.

(21) Appl. No.: 12/637,637

(22) Filed: Dec. 14, 2009

(65) Prior Publication Data

US 2010/0090242 A1 Apr. 15, 2010

Related U.S. Application Data

(62) Division of application No. 11/797,727, filed on May 7, 2007, now Pat. No. 7,652,295.

(30) Foreign Application Priority Data

| May 8, 2006 | (KR) | 10-2006-0041006 |
| Apr. 17, 2007 | (KR) | 10-2007-0037414 |
| Apr. 17, 2007 | (KR) | 10-2007-0037415 |
| Apr. 17, 2007 | (KR) | 10-2007-0037416 |

(51) Int. Cl.
| H01L 27/15 | (2006.01) |
| H01L 29/26 | (2006.01) |
| H01L 31/12 | (2006.01) |
| H01L 33/00 | (2006.01) |
| H01L 29/22 | (2006.01) |
| H01L 29/227 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl. ............ 257/79; 257/13; 257/94; 257/98; 257/E33.064

(58) Field of Classification Search ............ 257/13, 257/79, 94, 98, E33.064
See application file for complete search history.

(56) References Cited

U.S. PATENT DOCUMENTS

| 3,739,217 A | 6/1973 | Bergh et al. |
| 4,407,695 A | 10/1983 | Deckman et al. |
| 5,258,320 A | 11/1993 | Zavracky et al. |
| 5,300,788 A | 4/1994 | Fan et al. |
| 5,403,916 A | 4/1995 | Watanabe et al. |
| 5,453,405 A | 9/1995 | Fan et al. |
| 5,466,631 A | 11/1995 | Ichikawa et al. |
| 5,510,156 A | 4/1996 | Zhao |
| 5,939,734 A | 8/1999 | Hamaguchi |
| 5,955,749 A * | 9/1999 | Joannopoulos et al. ...... 257/98 |

(Continued)

FOREIGN PATENT DOCUMENTS

EP 1267420 A2 12/2002
(Continued)

*Primary Examiner* — Ida M Soward
(74) *Attorney, Agent, or Firm* — Birch, Stewart, Kolasch & Birch, LLP

(57) ABSTRACT

A nitride-based light emitting device capable of achieving an enhancement in emission efficiency and an enhancement in reliability is disclosed. The light emitting device includes a semiconductor layer, and a light extracting layer arranged on the semiconductor layer and made of a material having a refractive index equal to or higher than a reflective index of the semiconductor layer.

24 Claims, 36 Drawing Sheets

U.S. PATENT DOCUMENTS

| | | | |
|---|---|---|---|
| 6,134,043 A | 10/2000 | Johnson et al. | |
| 6,277,665 B1 | 8/2001 | Ma et al. | |
| 6,436,810 B1 | 8/2002 | Kumar et al. | |
| 6,445,000 B1 | 9/2002 | Masalkar et al. | |
| 6,495,862 B1 | 12/2002 | Okazaki et al. | |
| 6,504,180 B1 * | 1/2003 | Heremans et al. | 257/98 |
| 6,562,648 B1 | 5/2003 | Wong et al. | |
| 6,794,687 B1 | 9/2004 | Kurahashi et al. | |
| 6,798,960 B2 | 9/2004 | Hamada | |
| 6,810,067 B2 | 10/2004 | Masood et al. | |
| 6,811,324 B2 | 11/2004 | Morse | |
| 6,818,468 B2 | 11/2004 | Morse | |
| 6,818,531 B1 | 11/2004 | Yoo et al. | |
| 6,829,281 B2 | 12/2004 | Deng et al. | |
| 6,847,057 B1 * | 1/2005 | Gardner et al. | 257/99 |
| 6,901,194 B2 * | 5/2005 | Charlton et al. | 385/122 |
| 6,924,510 B2 | 8/2005 | Gardner et al. | |
| 7,012,279 B2 * | 3/2006 | Wierer Jr. et al. | 257/94 |
| 7,029,592 B2 | 4/2006 | Frendt | |
| 7,057,212 B2 * | 6/2006 | Kim et al. | 257/98 |
| 7,074,631 B2 | 7/2006 | Erchak et al. | |
| 7,091,526 B2 | 8/2006 | Ishizaki | |
| 7,102,175 B2 * | 9/2006 | Orita | 257/97 |
| 7,109,048 B2 * | 9/2006 | Ha et al. | 438/22 |
| 7,119,372 B2 * | 10/2006 | Stokes et al. | 257/79 |
| 7,154,125 B2 | 12/2006 | Koide et al. | |
| 7,170,100 B2 | 1/2007 | Erchak et al. | |
| 7,223,998 B2 | 5/2007 | Schwach et al. | |
| 7,294,862 B2 | 11/2007 | Wierer et al. | |
| 7,355,720 B1 | 4/2008 | Carr | |
| 7,385,226 B2 | 6/2008 | Ou et al. | |
| 7,442,964 B2 | 10/2008 | Wierer et al. | |
| 7,453,092 B2 | 11/2008 | Suehiro et al. | |
| 7,462,873 B2 | 12/2008 | Hoshi et al. | |
| 7,466,738 B2 | 12/2008 | Jikutani | |
| 7,477,671 B2 | 1/2009 | Sato et al. | |
| 7,495,263 B2 | 2/2009 | Kurahashi et al. | |
| 7,504,669 B2 * | 3/2009 | Erchak et al. | 257/98 |
| 7,521,727 B2 * | 4/2009 | Khanarian et al. | 257/98 |
| 7,563,629 B2 | 7/2009 | Lee et al. | |
| 7,569,863 B2 * | 8/2009 | Ueda | 257/97 |
| 7,601,988 B2 | 10/2009 | Seo et al. | |
| 7,615,798 B2 | 11/2009 | Sanga et al. | |
| 7,645,625 B2 | 1/2010 | Ono et al. | |
| 7,649,197 B2 | 1/2010 | Iwaki et al. | |
| 7,652,295 B2 | 1/2010 | Cho et al. | |
| 7,737,626 B2 | 6/2010 | Kumaki et al. | |
| 7,745,019 B2 | 6/2010 | Nomura et al. | |
| 7,763,903 B2 | 7/2010 | Orita | |
| 7,776,629 B2 | 8/2010 | David et al. | |
| 7,776,637 B2 | 8/2010 | Leem | |
| 7,785,908 B2 | 8/2010 | Yoo | |
| 7,785,989 B2 | 8/2010 | Sharps et al. | |
| 7,791,061 B2 | 9/2010 | Edmond et al. | |
| 7,811,839 B2 | 10/2010 | Kasahara et al. | |
| 7,829,881 B2 | 11/2010 | Yoon | |
| 7,829,906 B2 | 11/2010 | Donofrio | |
| 2003/0178626 A1 | 9/2003 | Sugiyama et al. | |
| 2003/0209722 A1 * | 11/2003 | Hatakoshi et al. | 257/98 |
| 2004/0136673 A1 | 7/2004 | Kinoshita | |
| 2005/0082562 A1 | 4/2005 | Ou et al. | |
| 2005/0173714 A1 | 8/2005 | Lee et al. | |
| 2005/0211995 A1 * | 9/2005 | Ou et al. | 257/80 |
| 2005/0258435 A1 | 11/2005 | Frchak et al. | |
| 2005/0270633 A1 | 12/2005 | Herman et al. | |
| 2005/0285132 A1 | 12/2005 | Orita | |
| 2006/0043400 A1 * | 3/2006 | Erchak et al. | 257/98 |
| 2006/0043402 A1 | 3/2006 | Suehiro et al. | |
| 2006/0054907 A1 | 3/2006 | Lai | |
| 2006/0056463 A1 | 3/2006 | Wang et al. | |
| 2006/0062540 A1 | 3/2006 | Zoorob et al. | |
| 2006/0102910 A1 | 5/2006 | Yamazaki et al. | |
| 2006/0118802 A1 * | 6/2006 | Lee et al. | 257/98 |
| 2006/0232203 A1 | 10/2006 | Noda | |
| 2006/0245464 A1 | 11/2006 | Hori et al. | |
| 2006/0270081 A1 | 11/2006 | Chua et al. | |
| 2008/0061307 A1 | 3/2008 | Ikeda et al. | |
| 2008/0142780 A1 | 6/2008 | Bader et al. | |
| 2008/0224165 A1 * | 9/2008 | Seong et al. | 257/99 |
| 2008/0283865 A1 | 11/2008 | Yoo et al. | |
| 2008/0315229 A1 * | 12/2008 | Yi et al. | 257/98 |
| 2009/0067774 A1 | 3/2009 | Magnusson | |
| 2010/0090234 A1 | 4/2010 | Cho et al. | |
| 2010/0090242 A1 | 4/2010 | Cho et al. | |
| 2010/0090243 A1 | 4/2010 | Cho et al. | |
| 2010/0093123 A1 | 4/2010 | Cho et al. | |

FOREIGN PATENT DOCUMENTS

| | | |
|---|---|---|
| EP | 1411603 A1 | 4/2004 |
| EP | 1577958 A1 | 9/2005 |
| EP | 1624499 A2 | 2/2006 |
| EP | 1858090 A2 | 11/2007 |
| JP | 2010-16066 A | 1/2010 |
| WO | WO-01/41225 A2 | 6/2001 |
| WO | WO 02/089218 A2 | 11/2002 |
| WO | WO-2006/096767 A1 | 9/2006 |
| WO | WO-2006/131087 A1 | 12/2006 |
| WO | WO-2007/009042 A1 | 1/2007 |
| WO | WO 2007/148866 A1 | 12/2007 |

* cited by examiner

LIGHT EMITTING DEVICE HAVING LIGHT EXTRACTION STRUCTURE

This application is a Divisional of application Ser. No. 11/797,727 filed on May 7, 2007 now U.S. Pat. No. 7,652,295, and for which priority is claimed under 35 U.S.C. §120; and this application claims the benefit of Korean Patent Application No. 10-2006-0041006, filed on May 8, 2006, Korean Patent Application No. 10-2007-0037414, filed on Apr. 17, 2007, Korean Patent Application No. 10-2007-0037415, filed on Apr. 17, 2007, and Korean Patent Application No. 10-2007-0037416, filed on Apr. 17, 2007. All these applications are hereby incorporated by references as if fully set forth herein.

BACKGROUND OF THE INVENTION

1. Field of the Invention

The present invention relates to a light emitting device and a method for manufacturing the same, and more particularly, to a light emitting device capable of achieving an enhancement in emission efficiency and an enhancement in reliability and a method for manufacturing the same.

2. Discussion of the Related Art

Light emitting diodes (LEDs) are well known as a semiconductor light emitting device which converts current to light, to emit light. Since a red LED using GaAsP compound semiconductor was made commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band-gap of the semiconductor material representing energy difference between valence-band electrons and conduction-band electrons.

Gallium nitride (GaN) compound semiconductor has been highlighted in the field of high-power electronic devices including light emitting diodes (LEDs) because it exhibits a high thermal stability and a wide band-gap of 0.8 to 6.2 eV.

One of the reasons why GaN compound semiconductor has been highlighted is that it is possible to fabricate semiconductor layers capable of emitting green, blue, and white light, using GaN in combination with other elements, for example, indium (In), aluminum (Al), etc.

Thus, it is possible to adjust the wavelength of light to be emitted, in accordance with the characteristics of a specific apparatus, using GaN in combination with other appropriate elements. For example, it is possible to fabricate a blue LED useful for optical recording or a white LED capable of replacing a glow lamp.

By virtue of the above-mentioned advantages of the GaN-based material, techniques associated with GaN-based electro-optic devices have rapidly developed since the GaN-based LEDs became commercially available in 1994.

The brightness or output of an LED manufactured using the above-mentioned GaN-based material mainly depends on the structure of an active layer, the extraction efficiency associated with external extraction of light, the size of the LED chip, the kind and angle of a mold used to assemble a lamp package, the fluorescent material used, etc.

SUMMARY OF THE INVENTION

Accordingly, the present invention is directed to a light emitting device and a method for manufacturing the same that substantially obviate one or more problems due to limitations and disadvantages of the related art.

An object of the present invention is to provide a light emitting device having a structure capable of achieving an enhancement in extraction efficiency while maintaining desired electrical characteristics when a light extracting structure is introduced into the light emitting device, and exhibiting an optimal extraction efficiency in cooperation with a photonic crystal structure, and a method for manufacturing the light emitting device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device comprises: a semiconductor layer; and a light extracting layer arranged on the semiconductor layer and made of a material having a refractive index equal to or higher than a reflective index of the semiconductor layer.

In another aspect of the present invention, a light emitting device comprises: a photonic crystal layer including at least two photonic crystal structures arranged in the same plane on a semiconductor layer, the photonic crystal structures having different periodicities.

In another aspect of the present invention, a light emitting device comprises: a photonic crystal layer including a first photonic crystal having a periodic structure and a second photonic crystal having a random structure, the first and second photonic crystals being arranged in the same plane on a semiconductor layer.

In another aspect of the present invention, a light emitting device comprises: a reflective electrode; a semiconductor layer arranged on the reflective electrode, the semiconductor layer including a light emitting layer; and a photonic crystal formed on the semiconductor layer, wherein a distance between the reflective electrode and a center of the light emitting layer is $0.65\lambda/n$ to $0.85\lambda/n$, where "$\lambda$" represents a wavelength of emitted light, and "n" represents a refractive index of the semiconductor layer.

In another aspect of the present invention, a light emitting device comprises: a reflective electrode; a semiconductor layer arranged on the reflective electrode, the semiconductor layer including a light emitting layer; and a photonic crystal formed on the semiconductor layer, wherein a distance between the reflective electrode and a center of the light emitting layer is an odd multiple of $\lambda/4$, where "$\lambda$" represents a wavelength of emitted light, and "n" represents a refractive index of the semiconductor layer.

In still another aspect of the present invention, a method for manufacturing a light emitting device comprises: growing a plurality of semiconductor layers over a substrate; forming a first electrode on the semiconductor layer; removing the substrate; forming a dielectric layer over the semiconductor layer exposed in accordance with the removal of the substrate; forming a plurality of holes in the dielectric layer; etching a surface of the dielectric layer formed with the holes, to form a plurality of grooves in the semiconductor layer; removing the dielectric layer; and forming a second electrode on a surface of the semiconductor layer exposed in accordance with the removal of the dielectric layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 28 to 30 illustrate a first embodiment of the present invention, in which:

FIG. 28 is a sectional view illustrating the first embodiment of the present invention;

FIG. 29 is a sectional view illustrating a horizontal light emitting device according to the first embodiment of the present invention; and FIG. 30 is a graph depicting an extraction efficiency depending on the refractive index of a light extracting layer;

FIGS. 31 to 35 illustrate a second embodiment of the present invention, in which:

FIG. 31 is a sectional view illustrating one example of a horizontal light emitting device structure according to the second embodiment of the present invention;

FIG. 32 is a sectional view illustrating another example of the horizontal light emitting device structure according to the second embodiment of the present invention;

FIG. 33 is a graph depicting a transmittance depending on the incidence angles of a transparent conducting layer and a transparent metal layer;

FIG. 34 is a graph depicting an extraction efficiency depending on the thickness of the transparent conducting layer; and FIG. 35 is a sectional view illustrating the light emitting device according to the second embodiment of the present invention;

FIGS. 37 to 47 illustrate a fourth embodiment of the present invention, in which:

FIG. 37 is a sectional view illustrating a light emitting device having periodicity-mixed photonic crystals;

FIG. 38 is a planar electro-microscopic photograph of the structure shown in FIG. 37;

FIG. 39 is a sectional electro-microscopic photograph of the structure shown in FIG. 37;

FIG. 40 is a plan view illustrating an example of the periodicity-mixed photonic crystals;

FIG. 41 is a sectional view corresponding to FIG. 40;

FIG. 42 is a graph depicting an extraction efficiency of a structure in which periodicity-mixed photonic crystals are introduced;

FIGS. 43 to 46 are sectional views illustrating embodiments of the periodicity-mixed photonic crystals; and FIG. 47 is a sectional view illustrating a vertical light emitting device having periodicity-mixed photonic crystals;

FIGS. 48 to 53 illustrate a fifth embodiment of the present invention, in which:

FIG. 48 is a sectional view illustrating an example of a light emitting device;

FIG. 49 is a sectional view illustrating another example of a light emitting device;

FIG. 50 is a graph depicting a variation in extraction efficiency depending on the thickness of an ohmic electrode in the structure of FIG. 49;

FIG. 51 is a graph depicting a variation in extraction efficiency depending on the thickness of a p-type semiconductor layer in the structure of FIG. 49;

FIG. 52 is a sectional view illustrating an example of a light emitting device package; and FIG. 53 is a sectional view illustrating another example of the light emitting device package;

FIGS. 54 to 66 illustrate a sixth embodiment of the present invention, in which:

FIG. 54 is a sectional view illustrating the step of forming an LED structure on a substrate;

FIG. 55 is a sectional view illustrating the step of removing the substrate, and forming a dielectric layer;

FIG. 56 is a sectional view illustrating the step of arranging a mask for formation of a hole pattern in the dielectric layer;

FIG. 57 is a sectional view illustrating the step of forming a plurality of holes in the dielectric layer;

FIGS. 58 to 62 are plan views illustrating examples of various hole patterns;

FIG. 63 is a schematic view illustrating a dry etching process;

FIG. 64 is a sectional view illustrating the step of forming a photonic crystal in an n-type semiconductor layer;

FIG. 65 is scanning electron microscope (SEM) image of the photonic crystal structure; and FIG. 66 is a sectional view illustrating the light emitting device structure.

DETAILED DESCRIPTION OF THE INVENTION

Figure 1:
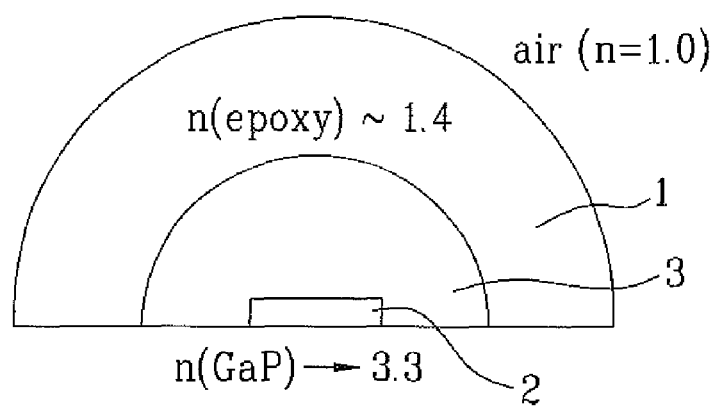
FIG. 1 is a sectional view illustrating a structure for achieving an enhancement in the extraction efficiency of a light emitting device.

The present invention now will be described more fully hereinafter with reference to the accompanying drawings, in which preferred embodiments of the invention are shown.

The present invention may, however, be embodied in many alternate forms and should not be construed as limited to the embodiments set forth herein. Accordingly, while the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

The extraction efficiency of a semiconductor light emitting device is determined by the refractive index difference between a semiconductor light emitting layer of the semiconductor light emitting device, from which light is emitted, and a medium (air or epoxy resin) through which the emitted light is finally observed. The extraction efficiency of a semiconductor medium is only several percentages because the semiconductor medium typically has a high refractive index ($n > 2$).

For example, in the case of a blue light emitting device made of a gallium nitride ($n=2.4$), the extraction efficiency for light emitted through a top layer of the light emitting device is only about 9% when it is assumed that the external medium is epoxy resin ($n=1.4$). Light other than the light emitted through the top layer is confined in the interior of the device due to a full reflection procedure, and then disappears as it is absorbed into an absorption layer such as a quantum well layer.

In order to enhance the extraction efficiency of such a semiconductor light emitting device, it is necessary to change the structure of the device such that light subjected to a full reflection procedure can be externally extracted. The simplest scheme for changing the structure of the semiconductor light emitting device is to coat a hemisphere made of a material having a high refractive index over the top layer of the device.

Since the incidence angle of light incident to a light incidence surface corresponds to an angle defined between the incident light and the light incidence surface, the incidence angle of light incident to the hemisphere is always 90° at any point on the hemisphere. The transmittance of light between two mediums having different refractive indexes is highest when the light incidence angle is 90°. Also, there is no angle, at which full reflection occurs, in any direction.

Practically, in the case of a semiconductor light emitting device, a hemisphere made of epoxy resin is coated over the device. In this case, the hemisphere contributes to protecting the surface of the device and enhancing the extraction efficiency of the device.

Figure 2:
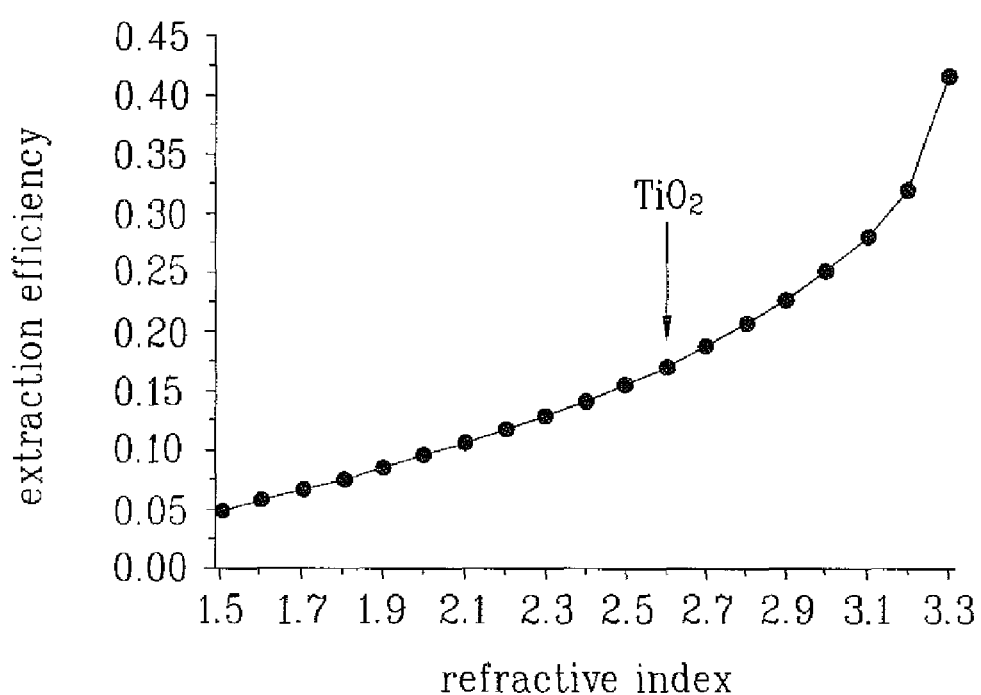
FIG. 2 is a graph depicting a variation in extraction efficiency depending on an increase in the refractive index of a hemisphere in FIG. 1.

In FIG. 1, a method for more effectively obtaining the above-described effects is illustrated. The illustrated method is additional introduction of a hemisphere 3 having a refractive index similar to that of a semiconductor between an epoxy layer 1 and a semiconductor device 2. In this case, as the refractive index of the additionally-introduced hemisphere 3 approximates to the refractive index of a semiconductor, the extraction efficiency of the semiconductor device 2 increases, as shown in FIG. 2.

This is because the critical angle between the semiconductor device 2 and the additionally-introduced hemisphere 3 increases.

As an example of a material exhibiting no absorption of light in a visible range and being transparent, $TiO_2$ may be proposed. For example, when it is assumed that a hemisphere made of the above-described material is applied to a red light emitting device, an enhancement in extraction efficiency corresponding to about 3 times the extraction efficiency of conventional cases can be theoretically obtained.

The additional introduction of a hemisphere having a high refractive index is a very simple and effective method. In order to apply this method, however, it is necessary to use a transparent material having a high refractive index and exhibiting no absorption of light in a light emission wavelength range.

Furthermore, there may be difficulties in association with processes for manufacturing a hemisphere having a size sufficiently covering the light emitting device and attaching the manufactured hemisphere to the light emitting device.

Another method for achieving an enhancement in external-extraction efficiency is to deform the side surfaces of a light emission structure into a pyramidal shape. This method utilizes the principle that light traveling laterally while being fully reflected within a light emitting device emerges from the top layer of the device after being reflected from the pyramidal surfaces.

However, this method has a drawback in that a desired enhancement is reduced as the size of the device increases. This is caused by absorption loss inevitably involved in the lateral travel of light. For this reason, in order to obtain an increased enhancement in a practical structure, it is important to cause light to be externally emitted after traveling along a path as short as possible.

To this end, research has been conducted to introduce a structure capable of alleviating the conditions of full reflection into a light emitting device. Representatively, there is a method in which the structure of a light emitting device is designed to have a resonator structure, to induce an output in a specific direction, starting from an initial stage, or a method in which hemispherical lenses having a size of several microns or more are arranged on the top layer of a light emitting device, to achieve an increase in critical angle.

However, the above-mentioned methods have not been practically used due to difficulties associated with manufacture processes. There is another method in which a rough surface having a size substantially corresponding to the wavelength of light is introduced into the output portion of a light emitting device, to achieve an enhancement in extraction efficiency through a light scattering procedure.

For the method for forming a rough surface on the top layer of a light emitting device, various chemical processes have been developed in association with materials used to manufacture light emitting devices. When light reaches a rough surface, a part of the light can pass through the rough surface even at an incidence angle corresponding to full reflection.

However, the light transmittance obtained by one scattering procedure is not so high. Accordingly, in order to expect a high light extraction effect, the same scattering procedure should be repeatedly carried out. For this reason, in the case of a light emitting device containing a material having a high absorbance, the extraction efficiency enhancement caused by the rough surface is small.

As compared to the above-mentioned method, when a photonic crystal having a spatially-periodic refractive index arrangement is introduced, it is possible to greatly enhance the extraction efficiency. Also, when an appropriate photonic crystal periodicity is selected, it is possible to adjust the directionality of the output of the light emitting device. Since view angle depends on the application of the light emitting device, it is considered that the design of the directionality meeting the application is an important task.

A large-area photonic crystal structure can be realized using holography lithography, ultraviolet (UV) photolithography, nano-imprinted lithography, or the like. Accordingly, this technique can be easily implemented for practical use thereof.

Efforts to enhance the extraction efficiency of a light emitting device through photonic crystals were made, starting from research for the adjustment of spontaneous emission rate using a photonic crystals.

Thereafter, the fact that photonic crystals contribute to an enhancement in the extraction efficiency of a light emitting device was theoretically proved. The contribution procedure of photonic crystals to the extraction efficiency enhancement is mainly summarized into two principles.

One principle is to cut off movement of light in a plane direction using a photonic band-gap effect, and thus, to extract light in a vertical direction. The other principle is to couple light with a mode having a high state density arranged outside a light cone in a dispersion curve, and thus, to externally extract the light.

The above-mentioned two principles can be independently applied in accordance with the periodicity of photonic crystals. However, it is possible to well define the photonic band-gap effect or the state density of the dispersion curve only when photonic crystals are formed under the condition in which there is a thin film which has a thickness corresponding to a half wavelength and a high refractive index contrast in a vertical direction.

Furthermore, since hole structures forming a photonic crystal extend through the light emitting layer, loss of a gain medium is inevitably generated. Additionally, it is impossible to avoid a reduction in internal quantum efficiency caused by surface nonradiative recombination.

It is considered that the photonic band-gap mirror effect or strong dispersion characteristics are applicable to specific cases because it is difficult to realize them in the structure of a general light emitting device. In order to solve this problem, a photonic crystal should be formed only on the surface of the light emitting device, without being formed on a positive medium of the light emitting device.

In this case, although it is impossible to utilize strong dispersion characteristics as in the case in which a photonic crystal is introduced into a thin film, it is possible to externally extract light associated with full reflection by coupling the light with a periodic structure in accordance with a general diffraction theory.

Currently, efforts to enhance the extraction efficiency without degrading the characteristics of a light emitting layer made of semiconductor by spatially separating a photonic crystal from the light emitting layer are being actively made.

Also, there was an effort to achieve an enhancement in extraction efficiency for a light emitting device using an InGaAs quantum well, in accordance with the same method as mentioned above. In addition, in association with an organic light emitting device, there was a report that it is possible to enhance the extraction efficiency of the organic light emitting device by 1.5 times, using a photonic crystal formed on a glass substrate.

There was also a method, in which a periodic photonic crystal structure is introduced into a semiconductor surface, to extract light confined due to full reflection, through a diffraction procedure, as mentioned above. For example, there was a report that it is possible to achieve an enhancement in extraction efficiency by forming a photonic crystal having a periodicity of 200 nm on a p-type GaN semiconductor surface.

In addition, there was a method in which a photonic crystal is formed even on the positive medium region of a GaN-based light emitting device, to achieve an increased enhancement in extraction efficiency using a photonic band-gap effect. In this method, however, there is a drawback of a reduction in extraction efficiency when input current increases. This is because, when a photonic crystal is introduced under the condition in which even the light emitting layer is etched, the current-voltage characteristics are particularly degraded, as mentioned above.

As apparent from the above description, the principle of an enhancement in external extraction efficiency of a light emitting device can be summarized into a method in which the structure of a light emitting device is changed to alleviate the conditions of full reflection, a method in which a rough surface is introduced into the surface of a light emitting device, a method in which a photonic crystal is formed in a thin film having a high refractive index contrast, to utilize a photonic band-gap effect, and a method in which a photonic crystal is separated from a light emitting layer, to externally extract light confined due to full reflection, through a diffraction procedure.

Of these methods, it is considered that the method, in which a periodic photonic crystal structure is introduced into the surface of a light emitting device, to achieve an enhancement in extraction efficiency, is best, taking into consideration the structure reality and efficiency enhancement of the light emitting device.

Figure 3:
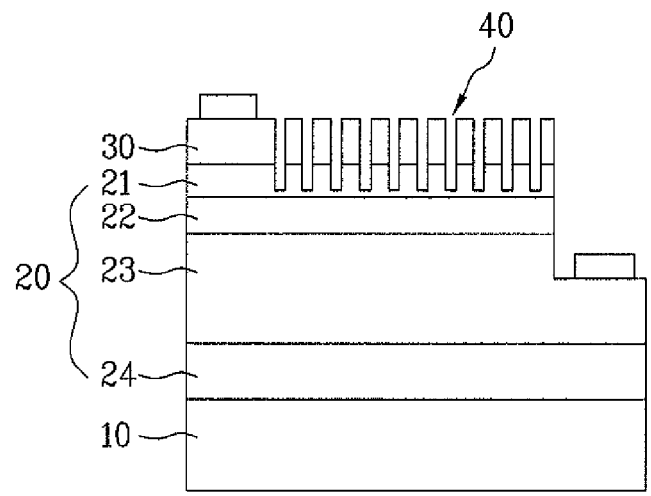
FIG. 3 is a sectional view illustrating an embodiment of a horizontal light emitting device having a photonic crystal structure.

FIG. 3 illustrates a horizontal GaN-based light emitting device in which a GaN semiconductor layer 20 is grown over a substrate 10 made of sapphire having a refractive index (n=1.76) lower than GaN. Since the GaN semiconductor layer 20 has a total thickness reaching about 5 μm, it is considered to be a waveguide structure in which various higher modes are present. The GaN semiconductor layer 20 includes, as a top layer portion thereof, a p-type GaN semiconductor layer 21. A multi-quantum well layer is arranged beneath the p-type GaN semiconductor layer 21, as a light emitting layer 22.

An n-type GaN semiconductor layer 23 is arranged beneath the light emitting layer 22. A buffer layer 24 may be interposed between the n-type GaN semiconductor layer 23 and the substrate 10. Also, a reflective film (not shown) may be formed on the substrate 10, opposite to the GaN semiconductor layer 20.

In order to uniformly supply current over the overall surface in the horizontal GaN-based light emitting device, a transparent electrode layer 30, which is typically made of indium tin oxide (ITO), is deposited over the p-type GaN semiconductor layer 21. Accordingly, the maximum etchable range for the introduction of a photonic crystal 40 into the horizontal GaN-based light emitting device corresponds to the sum of the thickness of the transparent electrode layer 30 and the thickness of the GaN semiconductor layer 21. Generally, the transparent electrode 30 and p-type GaN semiconductor layer 21 have a thickness of 100 to 300 nm.

Figure 4:
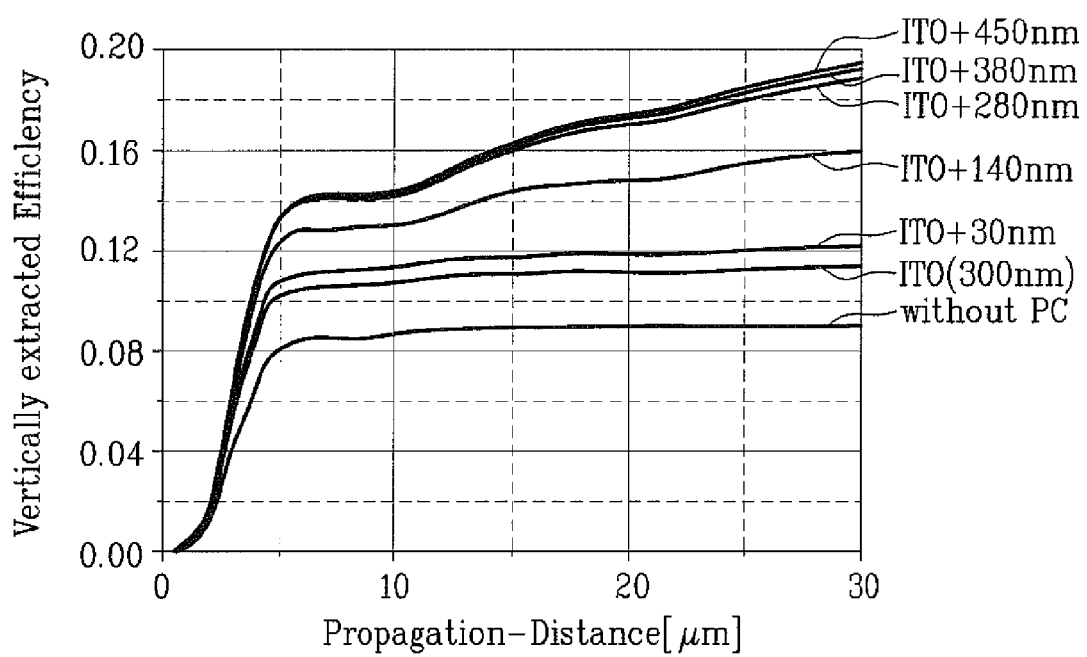
FIG. 4 is a graph depicting an extraction efficiency depending on a photonic crystal depth in the structure of FIG. 3.
Figure 5:
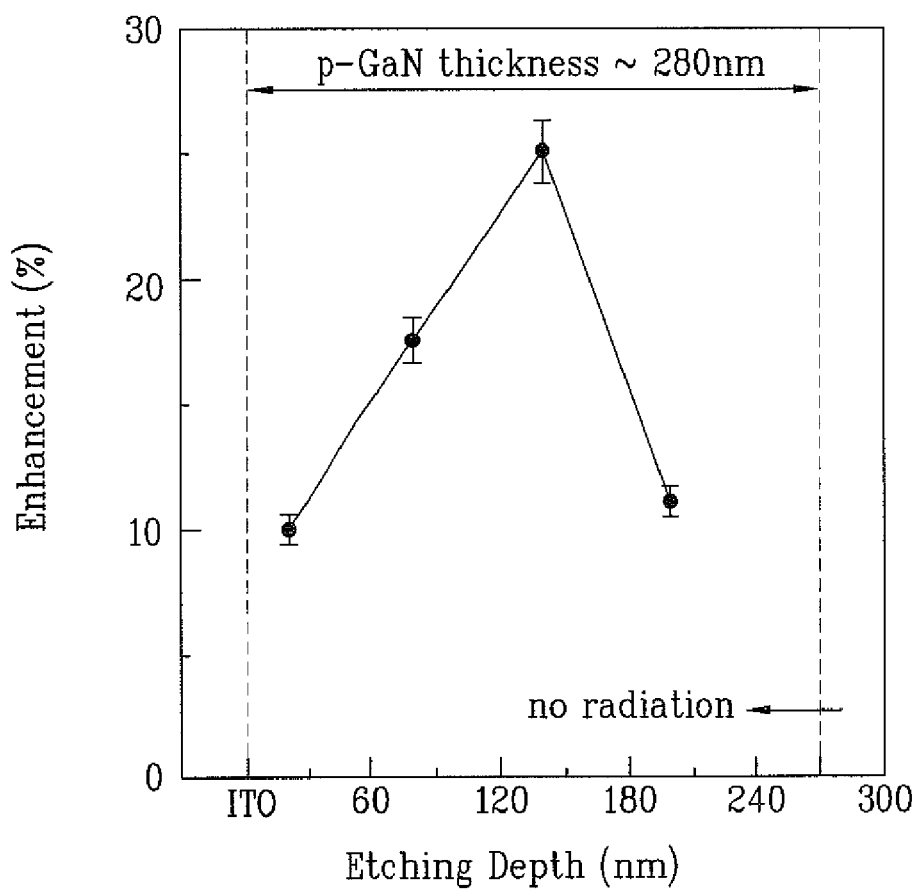
FIG. 5 is a graph depicting an extraction efficiency depending on etching depth in the case in which the thickness of a semiconductor layer is limited.

A calculation through a computer simulation (three-dimensional finite-difference time-domain (3D FDTD)) was conducted to identify the aspect of a variation in extraction efficiency depending on the etching depth of the photonic crystal. The results of the calculation through the computer simulation are depicted in FIG. 4. Referring to FIG. 4, it can be seen that there are two particular phenomena.

First, the extraction efficiency increases gently in proportion to the etching depth of the photonic crystal 40, and then increases sharply, starting from a region where the GaN semiconductor layer 20 begins to be etched. Second, at a certain etching depth or more, there is a tendency that the extraction efficiency is saturated without further increasing.

Collectively taking into consideration the above-mentioned two phenomena, it can be understood that it may be necessary to introduce the photonic crystal 40 into a region including the GaN semiconductor layer 20 under the condition in which the photonic crystal 40 has a certain etching depth or more.

Since the etching depth, at which the extraction efficiency is saturated, is similar to the thickness of the general p-type GaN semiconductor layer 21, it is possible to obtain a theoretical extraction efficiency saturation value without causing the region of the light emitting layer 22 to be etched.

However, in accordance with a practical experiment for checking a variation in light output depending on the etching depth of the photonic crystal 40, it is found that, when the p-type GaN semiconductor layer 21 is etched to a specific depth or more, the light output is rather reduced.

The reason why the light output is reduced in spite of the fact that the light emitting layer 22, namely, the quantum well structure, is not exposed is that an increase in resistance occurs due to a reduction in the volume of the p-type GaN semiconductor layer 21. Such a resistance increase may be more serious in application fields requiring high-power light emitting devices.

That is, the structure of a currently-available light emitting device with a photonic crystal cannot utilize the etching depth, at which a maximum extraction efficiency is obtained, due to an increase in resistance, from an optical point of view. Therefore, the matter to be solved is to develop a new structure to which an etching depth, at which the extraction efficiency obtained by the photonic crystal is maximum, is applicable without causing an increase in resistance.

Referring to the graph depicting a variation in extraction efficiency depending on etching depth, which is induced through the above-mentioned computer simulation, a clue to a new structure can be obtained. One particular phenomenon found in the graph is that, when the etching depth of the photonic crystal 40 transits from the ITO transparent electrode layer 30 to the GaN semiconductor layer 20, the extraction efficiency increases remarkably.

Basically, this is because the refractive index of ITO (n=1.8) is lower than the refractive index of the GaN semiconductor layer 20. The introduction of the photonic crystal 40 into a region having a low refractive index cannot be a great help to an enhancement in extraction efficiency. This can be understood that the photonic crystal 40 functions to extract light subjected to a full reflection procedure.

The extraction efficiency depends on how much the photonic crystal recognizes the region of the photonic crystal 40. Generally, when a full reflection phenomenon occurs, a surface evanescent wave is generated between two surfaces having different refractive indexes. The surface evanescent wave is present along the boundary surface of the two surfaces, and has characteristics of a exponential reduction in intensity in a direction perpendicular to the boundary surface.

For example, when only the ITO transparent electrode layer 30 is etched, the light associated with full reflection can recognize the photonic crystal 40 formed in the ITO transparent electrode layer 30 to a level corresponding to the intensity of the surface evanescent wave. Accordingly, it is impossible to expect a great enhancement in extraction efficiency.

Consequently, in order to extract a larger amount of light through the photonic crystal 40, a strong interaction between the photonic crystal 40 and the light is required. From a physical point of view, spatial overlap between the full reflection mode formed in the GaN-based light emitting device and the structure of the photonic crystal 40 functions as an important factor. That is, in order to disturb the surface evanescent wave generated during the full reflection procedure, it is necessary to etch the GaN semiconductor layer 20, for formation of the photonic crystal 40.

Meanwhile, the etching of the GaN semiconductor layer may also mean that a material having a refractive index similar to or higher than that of the GaN semiconductor layer is etched. That is, when the formation of the photonic crystal 40 is carried out after a material having a refractive index similar to that of the p-type GaN semiconductor layer is deposited over the p-type GaN semiconductor layer, it is possible to expect effects similar to those of the above-described case, even though the p-type GaN semiconductor layer is not etched.

Also, when the newly-deposited material has a refractive index higher than that of GaN, properties superior to the above-described effects of the photonic crystal may be exhibited. This is because the effects of the photonic crystal depend on the refractive index difference between two materials basically forming the light extracting structure.

Accordingly, when a light extracting structure for an enhancement in extraction efficiency is introduced into a GaN-based light emitting device, it is possible to achieve an enhancement in extraction efficiency while maintaining desired electrical characteristics by forming a light extracting structure such as photonic crystal in a material additionally introduced over the top layer of the light emitting device, namely, the GaN semiconductor layer (typically, p-GaN), without etching the GaN semiconductor layer.

The maximum etchable range for the introduction of the photonic crystal 40 into a horizontal GaN-based light emitting device is limited by the thickness (100 to 300 nm) of the p-type GaN semiconductor layer 21 forming the top layer of the light emitting device. For this reason, there may be a limitation on extraction efficiency.

Figure 6:
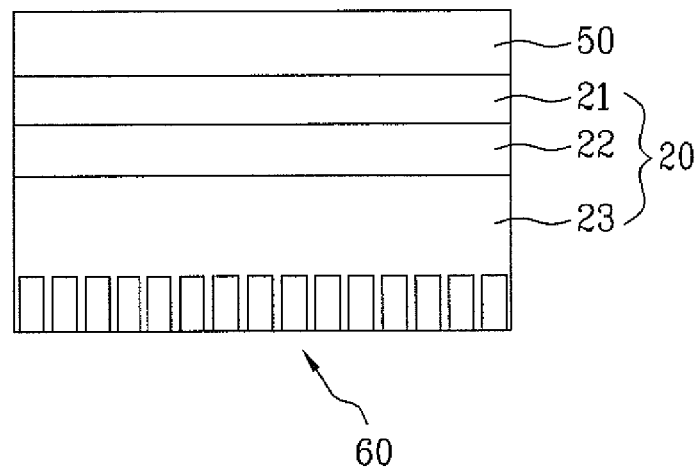
FIG. 6 is a sectional view illustrating an embodiment of a vertical light emitting device having a photonic crystal structure.

FIG. 6 illustrates an example of a vertical light emitting device. The illustrated vertical light emitting device has a structure in which the material of a substrate, namely, sapphire, is removed during a growth procedure of a GaN semiconductor layer 20, in accordance with a laser absorption process, and a reflective ohmic electrode 50 is formed over a p-type GaN semiconductor layer 21, using a multi-layer metal thin film made of Ni, Ag, etc. to function as both a mirror and an electrode.

The vertical GaN-based light emitting device is different from a general horizontal GaN-based light emitting device in that the flow direction of current is vertical due to the removal of an insulator, namely, sapphire, and the light output surface in the case of FIG. 6 is reversed such that light is output from an n-type GaN semiconductor layer 23.

The fact that current flows in a vertical direction in the vertical light emitting device structure means that it is quite probable that the supplied current can reach a light emitting layer 22, namely, a quantum well layer. This means that an enhancement in internal quantum efficiency can be achieved.

Also, the vertical light emitting device structure has characteristics capable of easily discharging heat because sapphire, which is an insulator, is removed, and a conductor is formed over the p-type GaN semiconductor layer 21. These characteristics may provide advantages upon designing a high-power light emitting device.

Practically, when the amount of the supplied current is larger than several hundred mA in the case of a general GaN-based blue light emitting device, the output is rather reduced. This may be analyzed to be caused by a degradation in the internal quantum efficiency of the quantum well due to an increase in the internal temperature of the device caused by the low heat conductivity of the sapphire substrate.

In addition to the physical characteristics of easy current flow and easy heat discharge, the vertical blue light emitting device structure has optical characteristics worth being taken into consideration in association with an enhancement in extraction efficiency. This will be described hereinafter.

First, the vertical light emitting device structure has an advantage in that, since the top layer of the vertical light emitting device structure is constituted by the n-type GaN semiconductor layer 23, a photonic layer 60 can be introduced into the n-type GaN semiconductor layer 23 which is relatively thicker than the p-type GaN semiconductor layer 21. Generally, the extraction efficiency enhancing effect obtained through the photonic crystal 60 is proportional to the etching depth until the enhancement efficiency is saturated.

Accordingly, it is possible to form a photonic crystal structure having a desired depth without a problem involved in the introduction of the photonic crystal, namely, an increase in resistance caused by the etching of the p-type GaN semiconductor layer, or any limitation associated with a surface nonradiative recombination caused by an active layer, namely, a quantum well layer. Also, since the periodicity for providing a maximum extraction efficiency varies slightly depending on the etching depth, it is possible to utilize structural conditions allowed by the given etching technique.

Also, in the vertical light emitting device, a quantum well layer (light emitting layer 22), which is a light emitting region, and a mirror (reflective ohmic electrode 50) are arranged at positions shorter than the wavelength of emitted light.

That is, as described above, in the structure of the vertical light emitting device, a reflective ohmic electrode 50 functioning as both a mirror and an electrode is formed over the p-type GaN semiconductor layer 21. Accordingly, the thickness of the p-type GaN semiconductor layer 21 corresponds to the gap between the light emitting layer 22 and a metal mirror in the light emitting device.

Generally, when a mirror having a high reflectance is present at a position near the light emitting layer 22, the light emission performance of the light emitting device may greatly vary, as compared to the case in which there is no mirror. That is, a variation in decay rate may occur in accordance with the gap between the light emitting layer 22 and the mirror. It may also be possible to adjust a radiation pattern in accordance with the gap between the light emitting layer 22 and the mirror. When these characteristics are appropriately used, it is possible to greatly enhance the extraction efficiency of the light emitting device.

Hereinafter, the procedure for determining structural factors of a photonic crystal applicable to a vertical GaN-based light emitting device and calculating a relative ratio of extraction efficiency enhancements obtainable by respective structural factors will be described.

Figure 7:
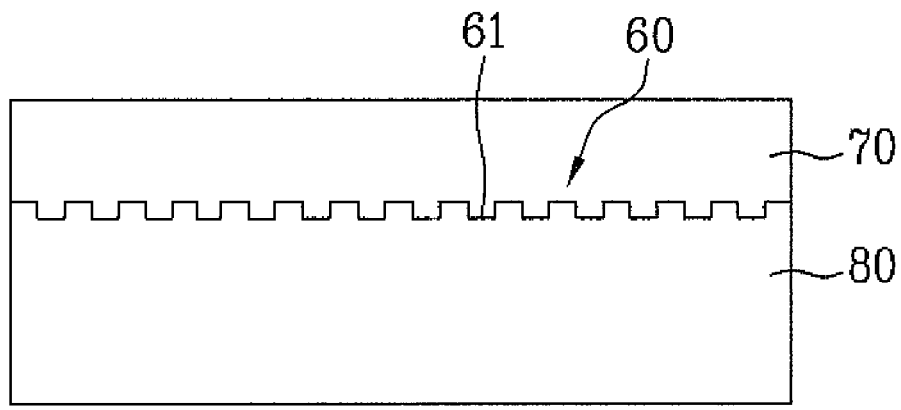
FIG. 7 is a sectional view illustrating a vertical light emitting device structure for a computer simulation.

The total efficiency of the vertical light emitting device structure corresponds to the efficiency obtained in accordance with vertical radiation because there is no radiation through side surfaces of the substrate in the vertical light emitting device structure, as compared to the horizontal structure. In FIG. 7, an example of a light emitting device structure to be analyzed through a computer simulation is illustrated. As shown in FIG. 7, the light emitting device structure includes a light-emitting semiconductor layer 80 formed with a photonic crystal 60. An epoxy resin layer 70 having a refractive index of 1.4, which is usable as a sealant, is arranged outside the photonic crystal 60.

It is impossible to completely include the size of a general light emitting device in the calculation structure due to a limited computer memory. In order to solve this problem, a method, in which perfect mirrors (not shown) are arranged at opposite ends of a light emitting device structure having a finite size (12 μm) was used.

Figure 8:
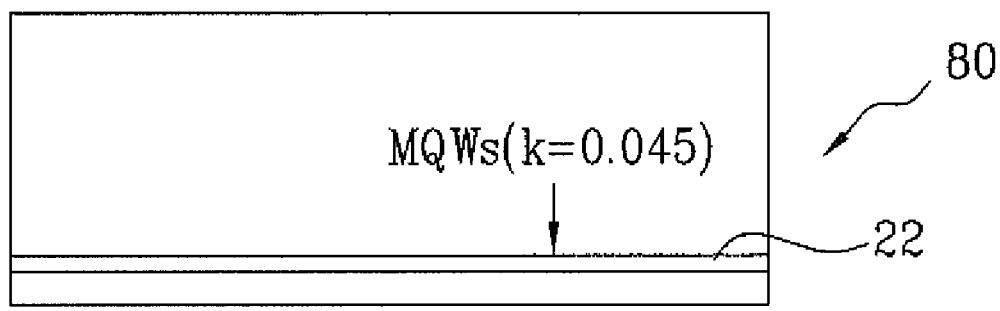
FIG. 8 is a sectional view illustrating the absorbance of a light emitting layer in the structure of FIG. 7.

Also, an absorbance k of 0.045 was given to the inside of the light emitting layer (quantum well layer 22) of the light emitting device 80, as shown in FIG. 8. However, for the convenience of analysis, an actual metal mirror, which exhibits a certain absorbance and is arranged at a lower end of the structure, was replaced by a perfect mirror having a reflectance of 100%.

Since an interference effect by a mirror should always be taken in the vertical structure, the relative position of the light emitting layer 22 to the mirror in the structure is an important parameter. This is because, when the radiation pattern is changed due to an interference effect generated between the mirror and the light emitting layer 22, the structural factors of the photonic crystal 60 to act effectively may be varied. That is, it may be considered that the angle of light, at which efficient light extraction occurs in accordance with a diffraction procedure, depends on the periodicity of the photonic crystal 60.

In this case, it is intended to calculate only the effect obtained by the photonic crystal 60 under the condition in which mirror effects are excluded. In order to exclude interference effects caused by the mirror, the gap between the mirror and the light emitting layer 22 is set to be long or to correspond to a middle condition between a reinforced interference condition and an offset interference condition.

Figure 9:
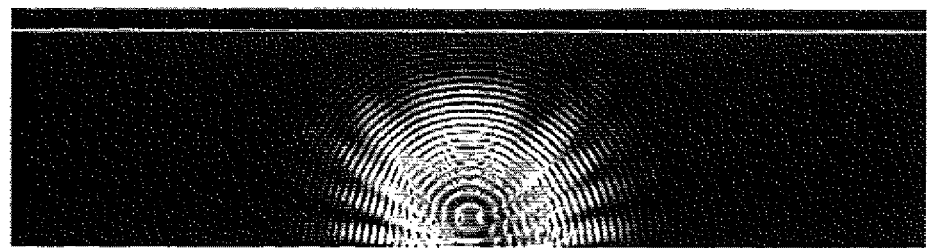
FIG. 9 is a photograph illustrating a radiation pattern exhibited in the case in which the light emitting layer is sufficiently spaced apart from a mirror.

The radiation pattern obtained when the light emitting layer 22 is free of the interference effects of the mirror, as described above, is illustrated in FIG. 9. This radiation pattern may be considered to be a spherical wave, even though fine interference patterns are still exhibited at specific angles.

Figure 10:
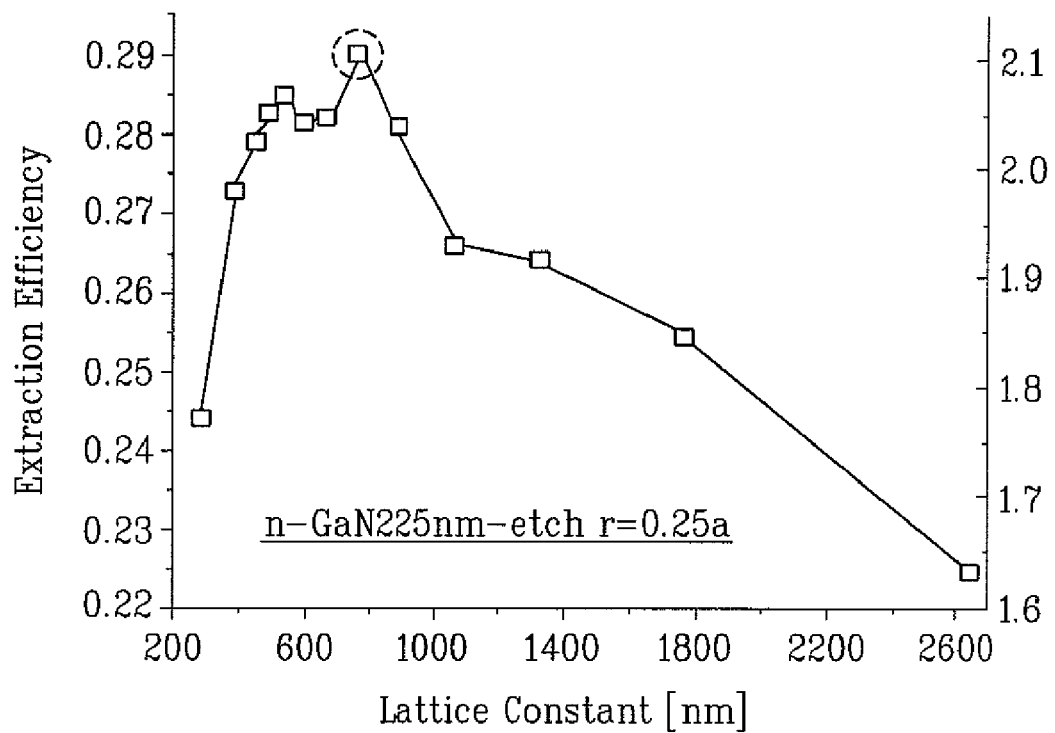
FIG. 10 is a graph depicting the results obtained by measuring an extraction efficiency while varying the periodicity of a photonic crystal.

A variation in extraction efficiency depending on the periodicity of the photonic crystal 60 is illustrated in FIG. 10. As shown in FIG. 10, the periodicity "a" of the photonic crystal 60, at which a maximum extraction efficiency can be obtained, is about 800 nm, and the relative enhancement in extraction efficiency is about 2 times. In this case, the etching depth was set to 225 nm, and the radius of holes 61 forming the photonic crystal 60 was set to 0.25 a when "a" represents the periodicity of the photonic crystal 60.

Figure 11:
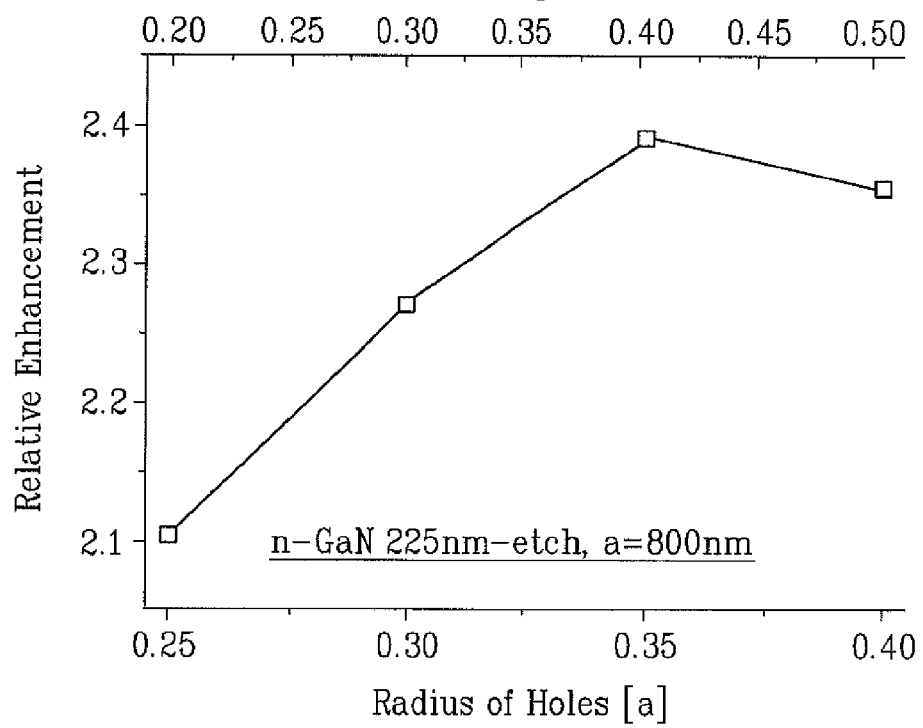
FIG. 11 is a graph depicting a variation in extraction efficiency depending on the size of holes forming the photonic crystal.
Figure 12:
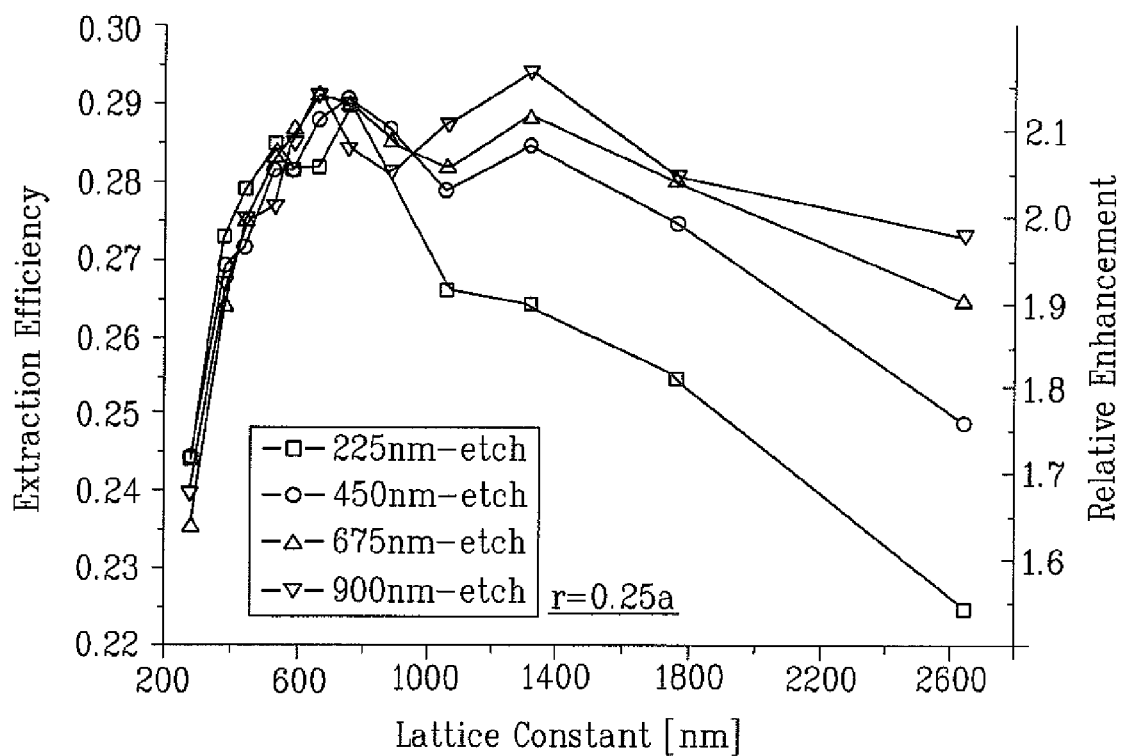
FIG. 12 is a graph depicting a variation in extraction efficiency depending on the etching depth of the photonic crystal.

A variation in extraction efficiency depending on the size of the holes 61 forming the photonic crystal 60 is illustrated in FIG. 11. In this case, the etching depth was set to 225 nm, and a periodicity of 800 nm was selected. Referring to FIG. 11, it can be seen that, when the size of the holes 61 forming the photonic crystal 60 corresponds to 0.35 a, a maximum extraction efficiency is obtained, and the relative enhancement increases to 2.4 times.

As described above, the vertical GaN-based light emitting device is advantageous in that the limitation on etching depth is small. Although the maximum etching depth in the horizontal structure is determined by the thickness of the p-type GaN semiconductor layer (actually, about half of the thickness of the p-GaN layer when an increase in resistance is taken into consideration), it is possible to use the thickness of the n-type GaN semiconductor layer (about 3 μm), which is much larger than the thickness of the p-type GaN semiconductor layer, in the vertical structure.

In order to utilize the above-described advantage of the vertical structure, an optimal periodicity depending on the etching depth for formation of the photonic crystal was checked while sequentially varying the etching depth.

As mentioned above in association with the research for the horizontal structure, there is a tendency that the extraction efficiency is saturated, at a certain etching depth or more.

However, there is an interesting fact that, when the etching depth increases, the extraction efficiency obtained by a photonic crystal structure having a long periodicity increases continuously. This is worthy of notice in that it is possible to use a photonic crystal structure having a long periodicity, which can be easily technically implemented, while increasing the etching depth.

Figure 13:
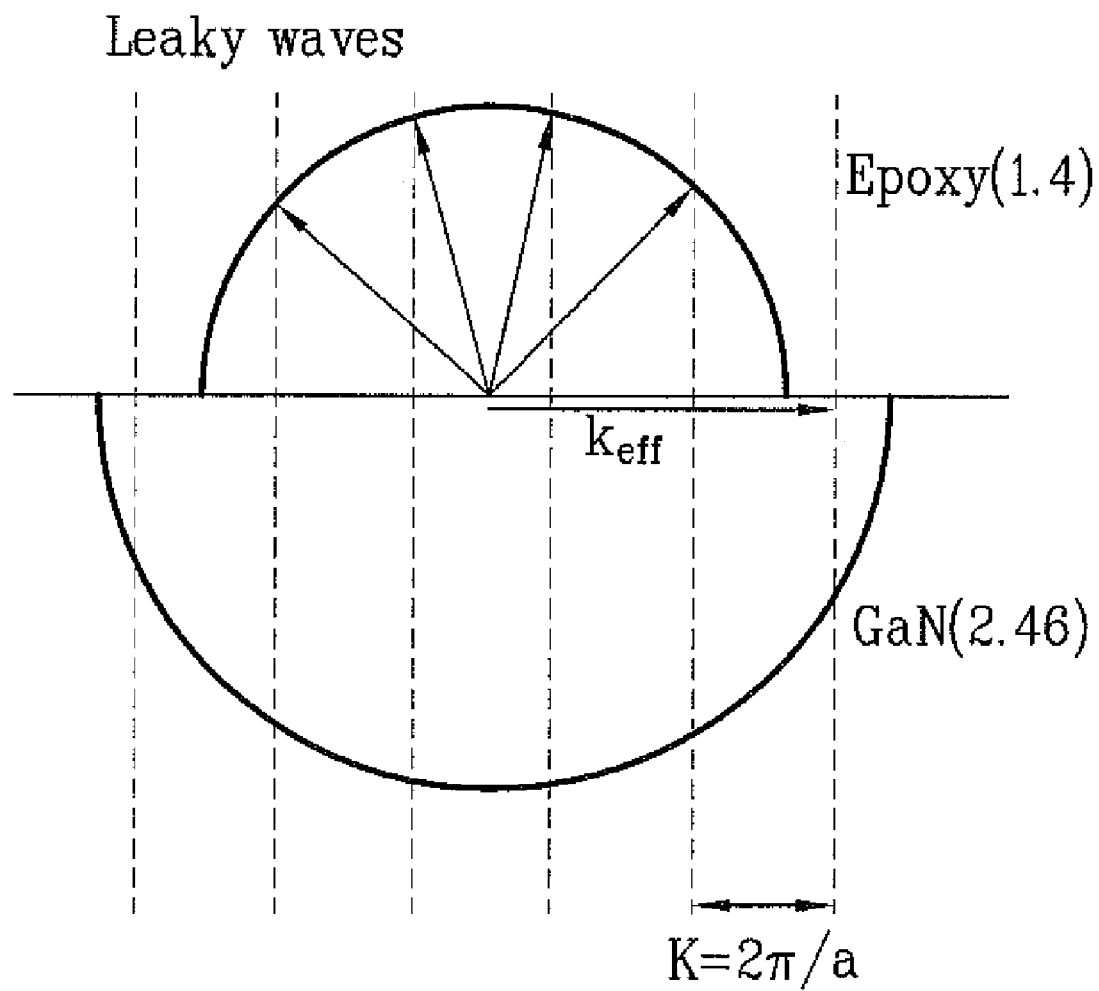
FIG. 13 is a schematic view illustrating a principle that a photonic crystal structure extracts light associated with a full-reflection angle.

The reason why the extraction efficiency of the photonic crystal structure having a long periodicity increases continuously as the etching depth increases may be analyzed as follows (FIG. 13).

First, light can pass through two mediums having different refractive indexes, only when the phase-matching condition in a plane direction is satisfied.

Second, when light propagates from a medium having a high refractive index to a medium having a low refractive index, it is impossible to satisfy the phase-matching condition at a specific angle or more. This specific angle is called a "critical angle". Full reflection occurs at the critical angle or more.

Third, the photonic crystal assists light associated with an angle causing full reflection to be externally extracted. That is, when the photonic crystal is coupled with light, the quantity of motion of the photonic crystal increases to allow the light associated with full reflection to satisfy the phase-matching condition.

Fourth, the quantity of motion of the photonic crystal is inversely proportional to the periodicity of the photonic crystal. That is, since the photonic crystal, which has a short periodicity, can generate a large quantity of motion, it can effectively extract light, which is included in light associated with full reflection, but propagates in a direction close to a horizontal direction far way from the critical angle. On the other hand, the photonic crystal, which has a long periodicity, is effective in extracting light propagating in a direction close to a vertical direction.

Fifth, in accordance with a theory of wave optics, the full reflection procedure carried out in a waveguide structure can be explained in association with modes. For example, light having an incidence angle close to a horizontal direction corresponds to a basic waveguide mode, and light having an incidence angle closer to a vertical direction corresponds to a higher waveguide mode.

Sixth, the GaN-based light emitting device can also be considered as a waveguide structure having a thickness of several microns or more.

Accordingly, it can be seen that the photonic crystal having a short periodicity is suitable to extract the basic wavelength mode, whereas the photonic crystal having a long periodicity is suitable to extract a higher wavelength mode. Thus, it is possible to determine an appropriate photonic crystal applicable to a GaN-based light emitting device, taking into consideration the above-described facts.

Generally, the basic wavelength mode exhibits a tendency of a saturation in extraction efficiency at a certain photonic crystal etching depth ($\sim\lambda/n$) or more. On the other hand, the higher wavelength mode exhibits a tendency of a continuous increase in extraction efficiency at an increased photonic crystal etching depth.

Consequently, the extraction efficiency for a higher waveguide mode by the photonic crystal structure having a long periodicity increases continuously as the etching depth increases.

In order to obtain a maximum extraction efficiency, a task for optimizing the structural factors of the photonic crystal was conducted through a calculation using a computer simulation. As a result, it was found that the extraction efficiency has a close relation with etching depth, hole size, periodicity, etc.

In particular, in the case of a vertical GaN-based light emitting device, there is no limitation on etching depth because a relatively-thick n-type GaN semiconductor layer is used to form a photonic crystal. Accordingly, when a large etching depth is introduced, it is also possible to increase the possibility that the periodicity, which can be implemented using the current technique, is selectable.

As described above, the incidence angle of effectively-acting light varies depending on the periodicity of the photonic crystal. That is, in a photonic crystal having only one periodicity, there is an incidence angle range in which a relatively-low diffraction efficiency is exhibited.

However, in order to maximize the extraction efficiency, the photonic crystal should exhibit a high diffraction efficiency for angles larger than the critical angle. Accordingly, in the case of a photonic crystal structure having two or more mixed periodicities, superior extraction efficiency characteristics may be exhibited, as compared to a photonic crystal in which only one periodicity is independently present.

A similar principle may be applied to a horizontal GaN-based light emitting device. The method for introducing a photonic crystal into a horizontal GaN-based light emitting device to achieve an enhancement in external extraction efficiency may be mainly divided into two methods in accordance with the introduction position of the photonic crystal.

Figure 14:
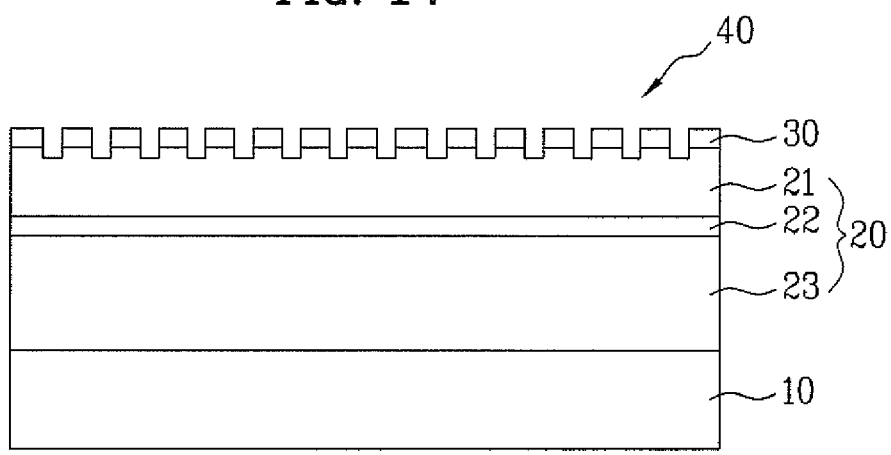
FIG. 14 is a sectional view illustrating a structure in which a photonic crystal is introduced into the top layer of a horizontal light emitting device.

One method is illustrated in FIG. 14. This method is to etch a specific portion of a semiconductor layer 20 formed over a sapphire substrate 10, namely, a p-type GaN semiconductor layer 21 arranged at the top of the light emitting device, as shown in FIG. 14. Where a transparent conductive layer 30 is formed over the p-type semiconductor layer 21, the transparent conductive layer 30 is also etched.

Figure 15:
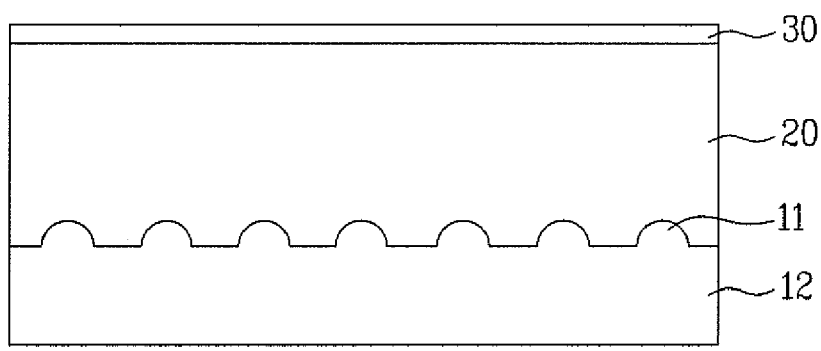
FIG. 15 is a sectional view illustrating a light emitting device structure formed on a patterned substrate.

The other method is illustrated in FIG. 15. This method is to grow a GaN semiconductor layer 20 over a patterned sapphire substrate (PSS) 12 previously formed with a pattern 11, as shown in FIG. 15.

Figure 16:
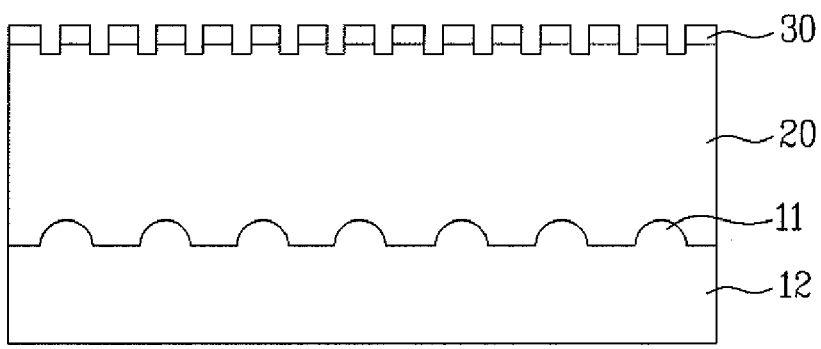
FIG. 16 is a sectional view illustrating a light emitting device structure in which both the photonic crystal and the patterned substrate are introduced.
Figure 17:
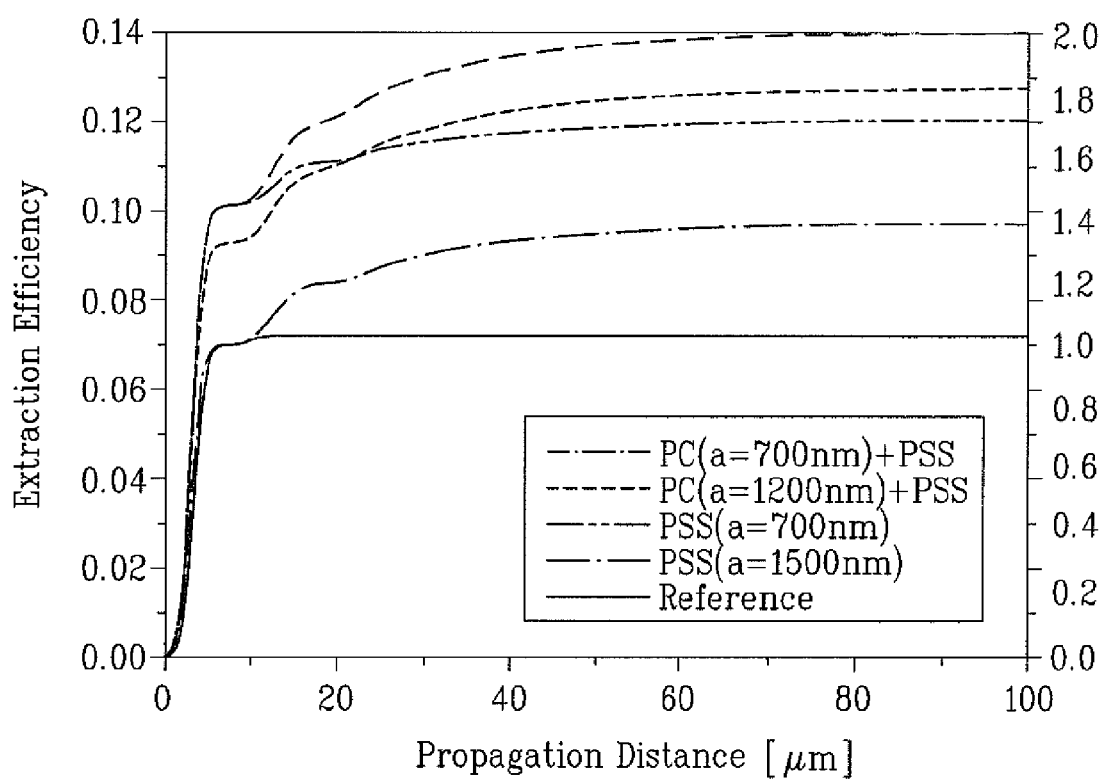
FIG. 17 is a graph depicting a variation in extraction efficiency depending on the propagation distance of light in association with the photonic crystal and the patterned substrate.
Figure 18:
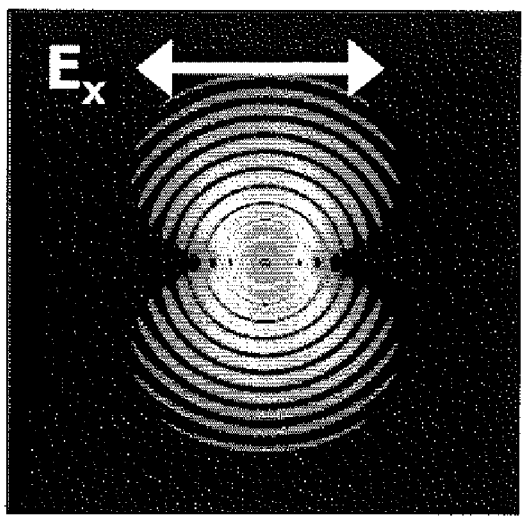
FIGS. 18 to 21 are photographs illustrating radiation patterns of electric dipoles.
Figure 19:
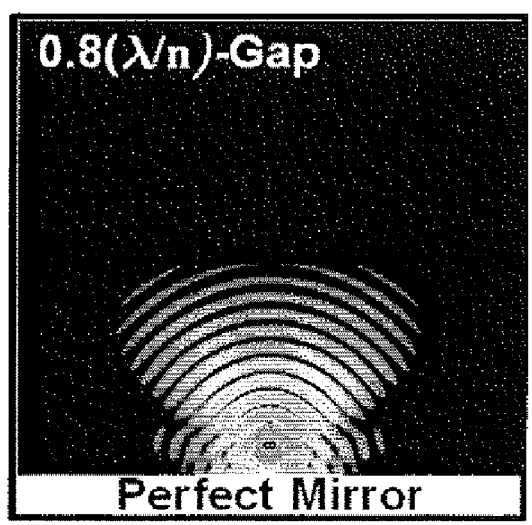
Figure 20:
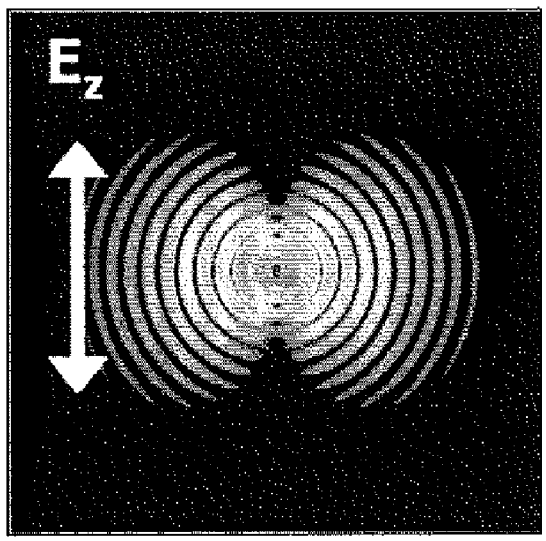
Figure 21:
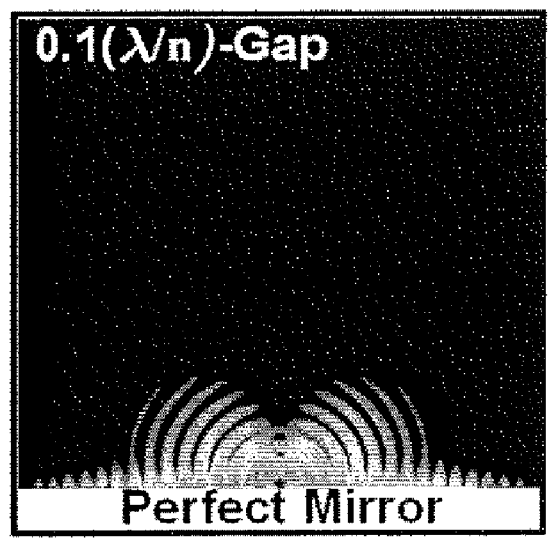

Meanwhile, a method to apply both the above-described structures may be implemented, as shown in FIG. 16. Graphs for comparison of extraction efficiencies respectively obtained in the above-described structures are shown in FIG. 17.

In the graphs, the horizontal axis represents the propagation distance of light in a calculation space, and the vertical axis represents the amount of externally-extracted light depending on the propagation distance of the light.

Referring to the graphs, it can be seen that, in the horizontal structure (reference), to which no periodic structure is applied, a saturation in extraction efficiency occurs before the propagation distance of light reaches 10 μm. Since the horizontal structure can extract only the light within the critical angle, most light exits in one transmission (reflection) procedure.

On the other hand, in the case, to which the structure of the photonic crystal 40 or the patterned sapphire substrate 12 with the pattern 11 is applied, a continuous increase in extraction efficiency is exhibited until the propagation distance of light reaches 100 μm. This is because light associated with full reflection is externally extracted in accordance with a diffraction procedure every time the light meets the periodic structure.

The extraction efficiency is finally saturated due to the absorbance of the inner material of the device. Accordingly, the basic principle applied to achieve an enhancement in external extraction efficiency in accordance with change of the structure or introduction of a periodic structure is to externally extract light within a propagation distance as short as possible such that the light is subjected to a reduced absorption loss.

From the above results, it can be seen that, when both the structure of the photonic crystal 40 and the patterned sapphire substrate 12 with the pattern 11 are applied, a maximum extraction efficiency is obtained.

The structure of the horizontal GaN-based light emitting device, in which the GaN semiconductor layer 20 is grown over the patterned sapphire substrate 12 formed with the pattern 11, and the photonic crystal 40 is applied to the top of the GaN semiconductor layer 20, may be technically defined as a structure in which photonic crystals having different periodicities are independently applied to different planes.

It is impossible to apply a photonic crystal structure having mixed periodicities to a vertical GaN-based light emitting device, different from the horizontal light emitting device. This is because the vertical GaN-based light emitting device has a substrate-removed structure. However, it is possible to apply a photonic crystal structure having different periodicities within one plane by utilizing the advantage of no limitation on etching depth.

Generally, it is possible to adjust the characteristics of the light emitting layer 22 when the gap between the light emitting layer 22 and a metal mirror having a high reflectance is shorter than the wavelength of light generated from the light emitting layer 22.

FIGS. 18 to 22 depict which phenomenon does occur when an electric dipole, which generates light, is arranged at a position very close to a perfect mirror, through an FDTD computer simulation. The electric dipole means an electron vibrating in a specific direction in accordance with polarized light.

In accordance with an antenna theory, light generated from an electric dipole has a radiation pattern having peaks distributed in a direction perpendicular to a vibrating direction of an electron. That is, when an electric dipole is positioned in a single dielectric space where no highly-reflective mirror is present, light generated from the electric dipole has a radiation pattern having peaks distributed in a direction perpendicular to each polarization direction.

However, when a mirror having a high reflectance is arranged near the electric dipole at a distance shorter than the wavelength of light, a great variation in light emission characteristics occurs. In accordance with the gap between the electric dipole and the mirror, light concentrates around a vertical line sometimes, or propagates along the plane of the mirror sometimes.

Taking such phenomena into consideration, it is possible to achieve an enhancement in extraction efficiency by initially applying the condition for generating light mainly having vertical components from the quantum well layer, namely, the light emitting layer 22. Also, although not depicted in FIGS. 18 to 21, it is possible to adjust a constant of nature, t (Decay rate corresponds to a reciprocal number of "t"), namely, the time taken for an excited electron to transit to a ground state.

As apparent from the above description, the feature that the light emission characteristics of the light emitting layer 22 can be adjusted mainly means the following two features.

One feature is that the output radiation pattern can be adjusted using an interference effect generated between light generated from the light emitting layer 22 and light reflected from the metal mirror. The other feature is that the decay rate can be adjusted through an interaction between a dipole in the light emitting layer 22 and an image dipole generated by the metal mirror.

The first feature can be explained using a traditional interference phenomenon of light. When the gap between the mirror and the light emitting layer 22 is sufficiently long to ignore an interference effect caused by the mirror, the light generated from the light emitting layer 22 can be considered as a spherical wave having a constant coefficient in all directions.

In the case in which the mirror is positioned near the light emitting layer 22 such that the radiation pattern is adjustable, occurrence of reinforced interference is advantageous in terms of extraction efficiency.

Again referring to the light emitting device as shown in FIG. 6, the gap between the light emitting layer 22 and the mirror (reflective electrode or reflective ohmic electrode 50) in the vertical light emitting device structure corresponds to the thickness of the p-type GaN semiconductor layer 21. Accordingly, it is necessary to select an appropriate thickness of the p-type GaN semiconductor layer 21 forming a vertical radiation pattern, within a range causing a degradation in electrical characteristics.

The second feature associated with the adjustment of light emission characteristics has a close relation with fields of resonator quantum electrodynamics. However, this feature, namely, the principle of qualitatively adjusting a decay rate, can be easily explained, using the symmetry of the mirror.

Figure 22:
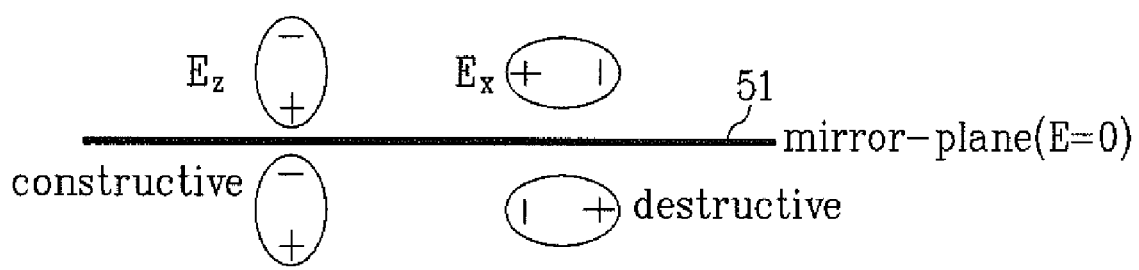
FIG. 22 is a schematic view illustrating an arrangement of dipoles with respect to the plane of a mirror.

FIG. 22 schematically shows the figures of vertically and horizontally-polarized electric dipoles arranged around the plane of a mirror 51. In accordance with an electromagnetic field theory, the electric field on the plane of the mirror 51 should always be "0".

Using this principle, the situation that electric dipoles are arranged around the mirror 51 can be realized through a combination of an electric dipole and an image dipole arranged at opposite sides of the mirror 51 while being spaced apart from the mirror 51 by the same distance.

For example, in the case of an electric dipole having polarities in a z-direction, the dipole moment thereof should have the same direction as that of an image dipole, in order to satisfy the electric field condition on the plane of the mirror 51. Accordingly, as the gap between the electric dipole and the mirror 51 is reduced, an effect as if two electric dipoles overlap with each other is generated. As a result, an effect of increasing the decay rate by four times is generated.

On the other hand, when an electric dipole having polarities in a horizontal direction is applied to the electric field condition on the plane of the mirror 51, an image dipole with a dipole moment in a direction opposite to that of the electric dipole is always induced. Accordingly, as the horizontally-polarized electric dipole approaches the plane of the mirror 51, the decay rate approximates to "0".

Figure 23:
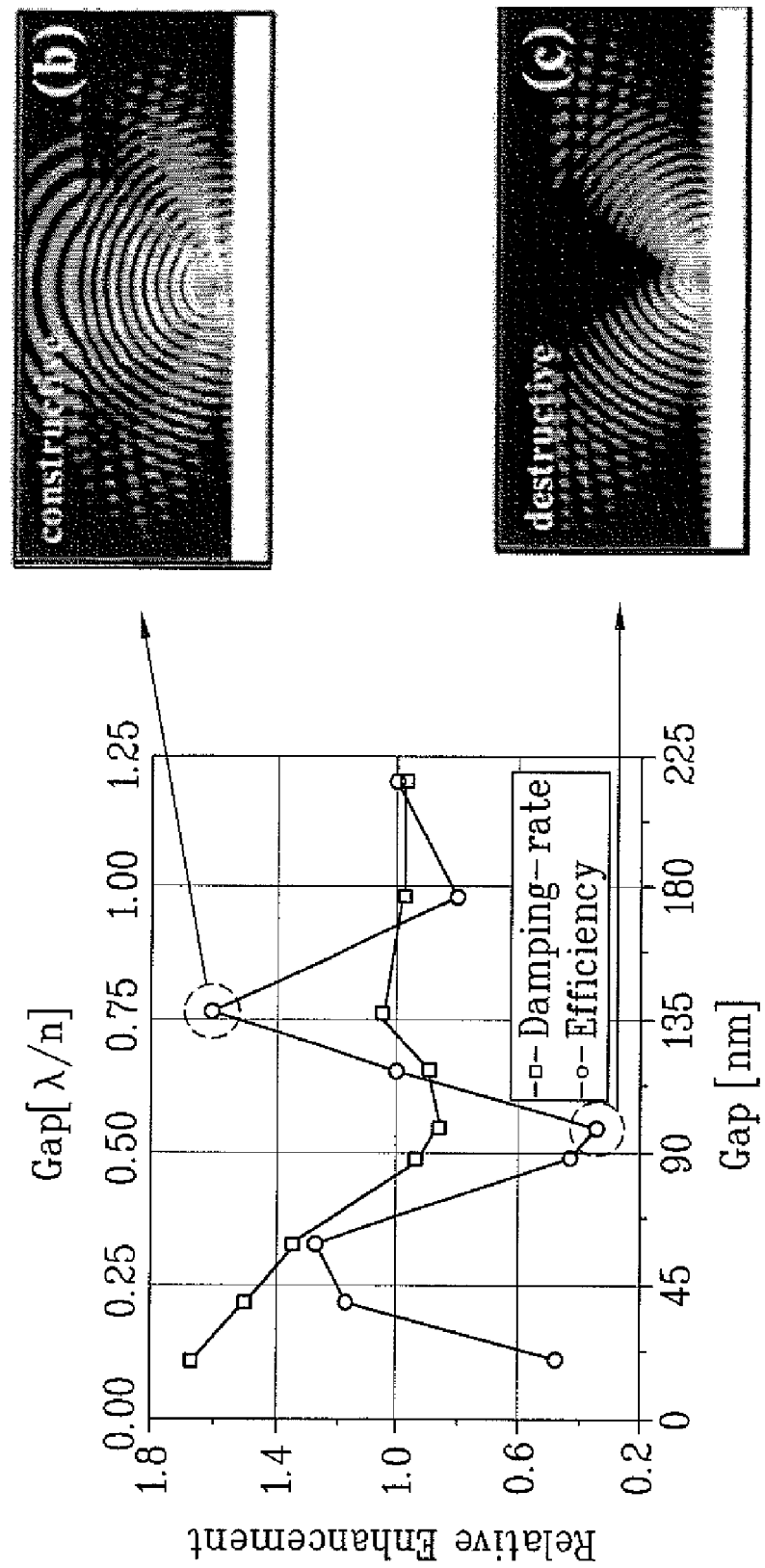
FIG. 23 illustrates an extraction efficiency enhancement depending on the gap between the mirror and the light emitting layer and an associated radiation pattern, through a graph and photographs.

An arithmetic calculation was conducted, through an FDTD computer simulation, for a variation in extraction efficiency enhancement and a variation in the decay rate of the light emitting layer depending on a variation in output pattern, while adjusting the gap between the mirror and the light emitting layer, as shown in FIG. 23. In this case, the mirror was assumed as a perfect mirror having a reflectance of 100%, and the thickness of the light emitting layer was set to 12.5 mm.

First referring to the results as to extraction efficiency enhancement, it can be seen that an extraction efficiency peak and an extraction efficiency valley are exhibited at intervals of about ¼ wavelength of light. This is an evidence identifying that the radiation pattern is varied due to an interference effect of light, and thus, the extraction efficiency is adjusted.

After observing the radiation patterns at the peak and valley, it can be seen that, actually, strong emission of light in a vertical direction occurs at the peak, whereas, at the valley, there is no or little vertical light, and most light is emitted in a state of being inclined at a specific angle larger than the critical angle.

It can be seen that a maximum extraction efficiency is obtained when the gap between the light emitting layer and the mirror is about ¾(λ/n), and a large extraction efficiency is obtained when the gap corresponds to about an odd multiple of λ/4n.

In order to practically apply the interference effect obtained by the mirror to the vertical GaN-based light emitting device structure, it is necessary to solve the matters assumed in the computer simulation. In particular, although the light emitting layer was assumed approximately as a point light source, in the computer simulation, the quantum well layer of the practical light emitting device has a thickness of about 50 to 100 nm in accordance with the number of laminated pairs thereof.

However, when the thickness of the light emitting layer is larger than λ/4n, the interference effect by the mirror is reduced, and may finally disappear. Accordingly, it is necessary to provide a growth technique for reducing the thickness of the quantum well layer while maintaining a desired internal quantum efficiency.

Next, referring to the results as to decay rate variation, it can be seen that there are characteristics of an increase in decay rate as the gap between the mirror and the light emitting layer is reduced. That is, as the mirror approaches the light emitting layer, the circulation procedure of a gain medium is more rapidly carried out. However, it should be noted that a variation in decay rate does not always cause an increase in extraction efficiency.

The decay rate is only an index indicating how fast an electron and a hole coupled in the light emitting layer can be converted into photo energy. Accordingly, for the relation between the decay rate and the extraction efficiency, it is also necessary to take into consideration the decay rate caused by nonradiative recombination of a gain medium in the light emitting layer.

Although it is difficult to directly substitute a variation in extraction efficiency for a variation in decay rate, it is possible to analogize a qualitative relation that an increase in decay rate causes a more active radiative recombination, and thus, a reduction in the probability of nonradiative recombination, so that an enhancement in extraction efficiency will be induced.

Figure 24:
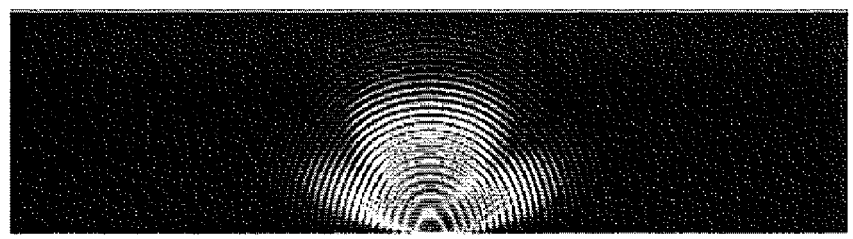
FIG. 24 is a photograph illustrating a radiation pattern in the case in which the gap between the light emitting layer and the mirror falls under a reinforced interference condition.

Hereinafter, the effect of the photonic crystal when the gap between the mirror and the light emitting layer falls under the reinforced interference condition will be described. The reinforced interference condition is established when the gap corresponds to about ¾ (λ/n). The radiation pattern generated under the reinforced interference condition is shown in FIG. 24. When this radiation pattern is compared with that of FIG. 10, it can be seen that a relatively large amount of light propagates in a vertical direction.

Figure 25:
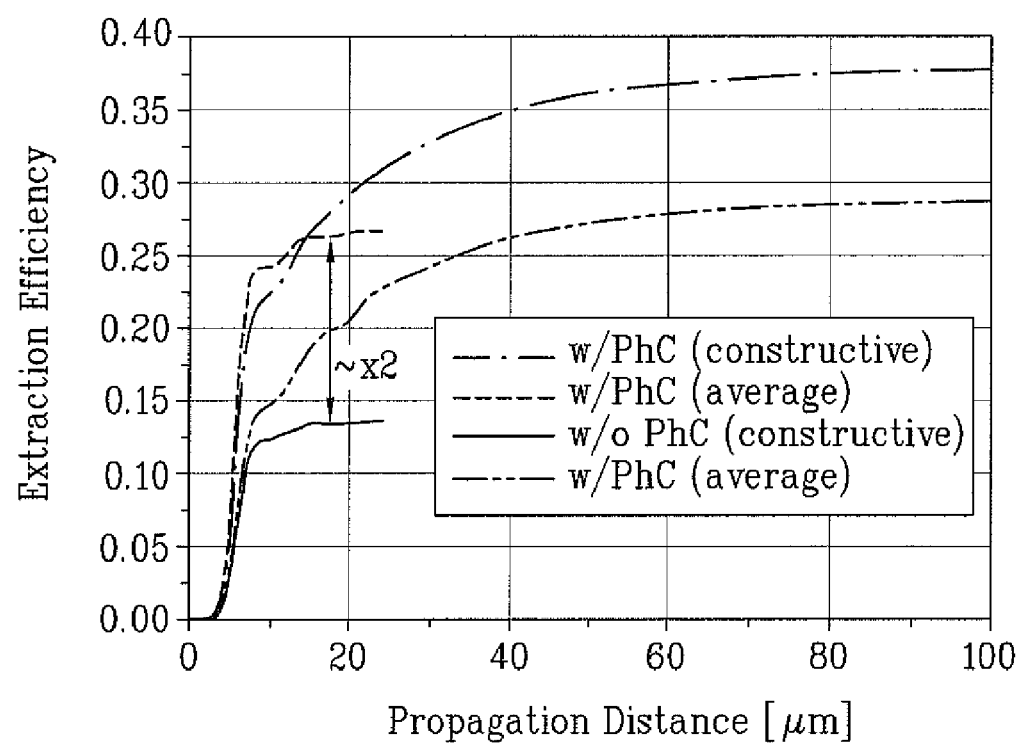
FIG. 25 is a graph depicting effects obtained in accordance with introduction of a photonic crystal in a structure having a reinforced interference condition.

The results of a measurement for an extraction efficiency enhancement obtained when a photonic crystal is introduced under the above-described condition are shown in FIG. 25.

For a structure to which no photonic crystal is applied, the reinforced interference condition provides an extraction efficiency enhancement corresponding to about 2 times that of the spherical wave condition providing no or little mirror effect. The reason why the extraction efficiency enhancement in this case is higher than the extraction efficiency enhancement calculated in association with the calculation of the interference effect by the mirror (increased by 1.6 times) is that the absorbance was taken into consideration in this structure.

When graphs associated with the cases, to which a photonic crystal (periodicity=800 nm, and etching depth=225 nm) is applied, are compared, it can be seen that the structure, to which the reinforced interference condition is applied, exhibits best characteristics.

Of course, in the structure, to which the reinforced interference condition is applied, the relative enhancement exhibited across the photonic crystal is a maximum of about 1.2 times. This is because a large portion of the light generated in the light emitting layer is initially within the critical angle, so that the amount of light extracted through the photonic crystal is correspondingly reduced.

Figure 26:
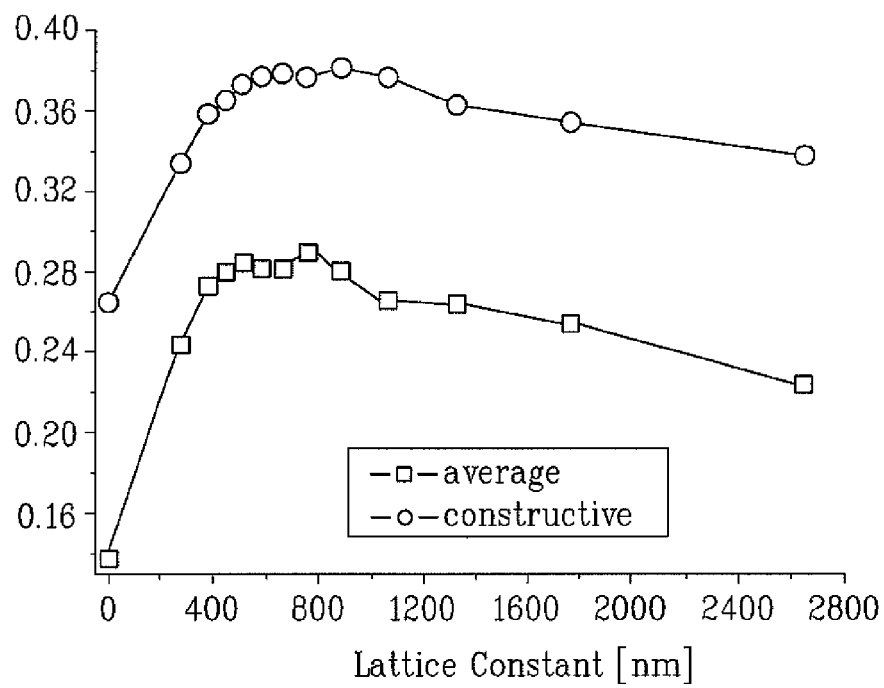
FIG. 26 is a graph depicting a variation in extraction efficiency depending on the periodicity of the photonic crystal at a fixed etching depth.

The results of a measurement for a variation in extraction efficiency depending on the periodicity of the photonic crystal under the reinforced interference condition are shown in FIG. 26.

In this case, the etching depth of the photonic crystal was fixed to 225 nm. Also, the size of holes forming the photonic crystal was 0.25 a. In order to identify the dependency of the extraction efficiency on the periodicity of the photonic crystal under the reinforced interference condition and under a normal condition, two results thereof were depicted in one graph.

Referring to the results, it can be seen that there is no remarkable difference between the optimal periodicity of the photonic crystal under the reinforced interference condition and the optimal periodicity of the photonic crystal under the normal condition, and the optimal periodicities are in the vicinity of 800 nm.

Hereinafter, a variation in extraction efficiency depending on the etching depth of the photonic crystal will be described with reference to FIG. 27.

Under a normal condition in which the output pattern of the light emitting layer may be assumed as a spherical wave, the periodicity of the photonic crystal can be divided, with reference to a periodicity of about 1 µm, into a periodicity, in which the extraction efficiency is saturated at a certain etching depth, and a periodicity, in which the extraction efficiency increases continuously in proportion to an increase in etching depth.

This is because the photonic crystal can more effectively diffract fully-reflected light near the critical angle when the photonic crystal has a longer periodicity. When this principle is applied to the currently-discussed reinforced interference condition, it can be expected that the function of the photonic crystal having a longer periodicity becomes more important because radiation of light in a vertical direction is initially carried out under the above-described condition.

Figure 27:
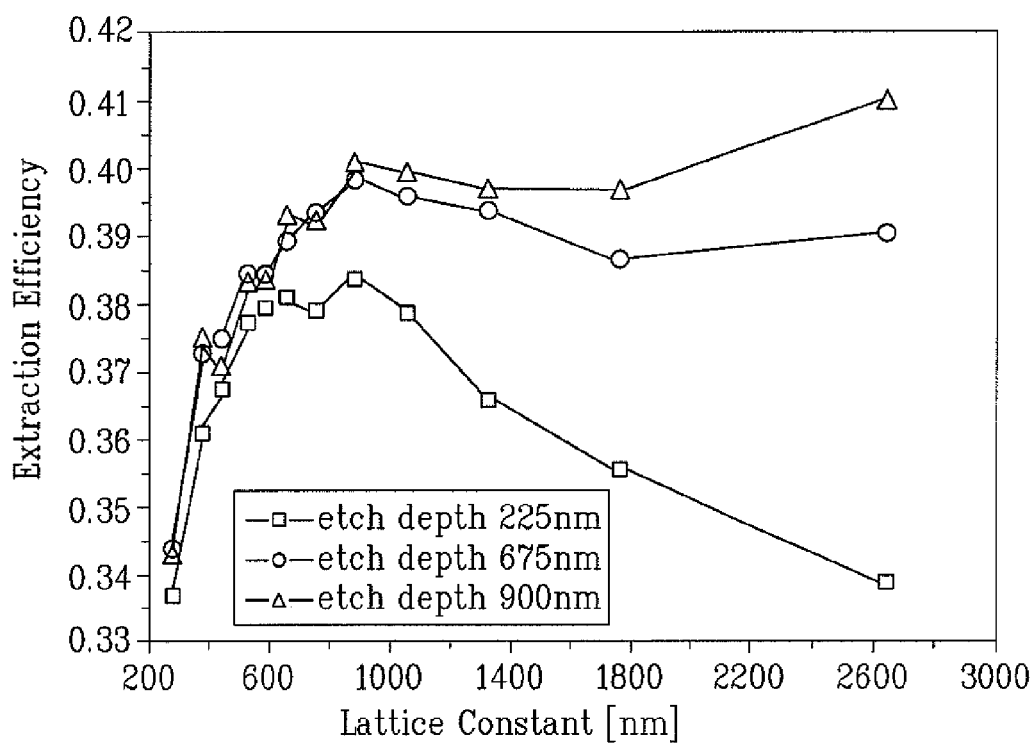
FIG. 27 is a graph depicting a variation in extraction efficiency depending on etching depth under a reinforced interference condition.

In order to verify this effect, the extraction efficiency according to the periodicity was calculated through a calculation using a computer simulation, while varying the etching depth, as shown in FIG. 27. After a comparison of this condition with the normal condition, it can be more clearly seen that the optimal periodicity, in which a maximum extraction efficiency is obtained, is shifted in a longer-periodicity direction as the etching depth increases.

For example, when the etching depth is 900 nm, the optimal periodicity is found at 2 µm or more. This corresponds to a structure which can be manufactured using the resolution of the current general photolithography, so that it is highly significant in terms of practical use.

First Embodiment

Figure 28:
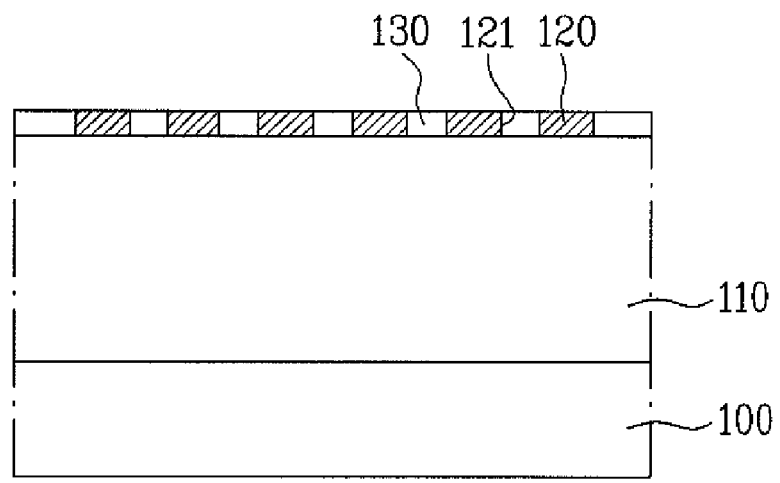

As shown in FIG. 28, a light extracting layer 120 is formed over a GaN-based semiconductor layer 110 previously formed over a substrate 100, using a material having a refractive index similar to or higher than that of the semiconductor layer 110.

The light extracting layer 120 may have a specific pattern. The specific pattern may form a photonic crystal having a periodic structure. The formation of such a photonic crystal may be achieved through an etching method or other patterning methods.

For the formation of the photonic crystal structure, a positive lithography for forming holes 121 or a negative lithography for forming rods is usable.

The photonic crystal pattern may be formed by forming the light extracting layer 120 in accordance with a deposition process, and then subjecting the light extracting layer 120 to a lithography process and an etching process. Alternatively, the photonic crystal pattern may be formed by performing a lithography on the semiconductor layer 110, depositing the light extracting layer 120, and then performing a lift-off process.

When the above-described photonic crystal structure is arranged on a surface of the light emitting device, it is possible to extract light confined due to full reflection, through a diffraction procedure, and thus, to achieve an enhancement in extraction efficiency. However, even in the case in which the light extracting layer 120 has a specific pattern as described above, it is also possible to enhance the extraction efficiency by forming a rough surface.

A transparent electrode material may be formed in the holes 121 of the light extracting layer 120, which form the photonic crystal. For the transparent electrode material, a transparent conducting oxide (TCO) 130 may be used.

For the transparent conducting oxide 130, indium tin oxide (ITO) may be used. Also, indium zinc oxide (IZO), aluminum zinc oxide (AZO), magnesium zinc oxide (MZO), or gallium zinc oxide (GZO) may be used.

When the semiconductor layer 110 is a gallium nitride layer, the light extracting layer 120 may have a refractive index of about 2.4 or more because the refractive index of gallium nitride is 2.4. The refractive index of the light extracting layer 120 may also be slightly lower than 2.4.

For the light extracting layer 120, an oxide or a nitride may also be used. In particular, SiN or $TiO_2$ may be used.

Figure 29:
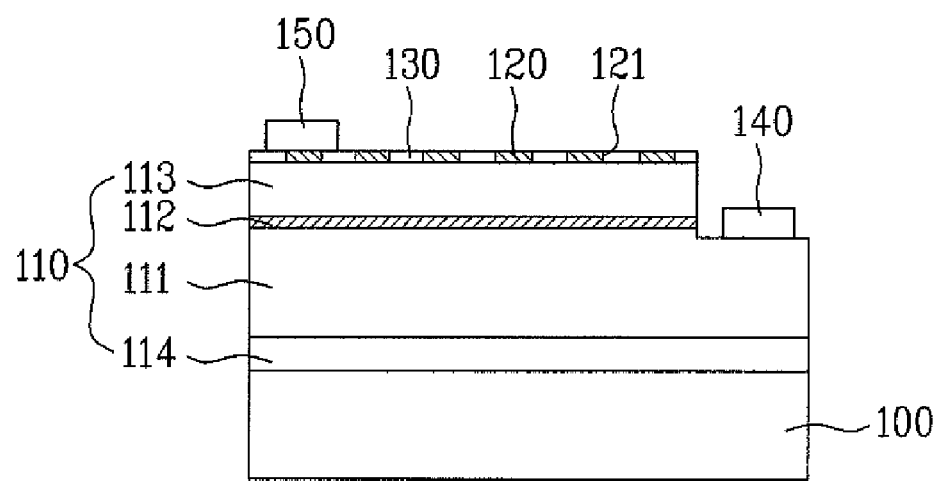

FIG. 29 illustrates the structure of a horizontal light emitting device having the above-described light extracting layer 120. The semiconductor layer 110 may include an n-type semiconductor layer 111, an active layer 112, and a p-type semiconductor layer 113 which are sequentially formed over the substrate 100 in this order. Also, the substrate 100 is made of sapphire having a refractive index of 1.78. If necessary, a buffer layer 114 may be interposed between the substrate 100 and the n-type semiconductor layer 111.

The p-type semiconductor layer 113 arranged adjacent to the light extracting layer 120 may completely maintain the thickness obtained upon laminating the layer 113, without being etched upon patterning the light extracting layer 120. The thickness of the p-type semiconductor layer 113 may be 30 to 500 nm. Also, the light extracting layer 120 may have a thickness of 150 nm or more.

In FIG. 29, the pattern of the light extracting layer 120 is shown in an enlarged state. The pattern of the light extracting layer 120 is constituted by a plurality of holes 121 forming a photonic crystal in a GaN semiconductor. The radius, depth, and periodicity of the holes 121 may be optimized for the associated semiconductor layer 110.

That is, when it is assumed that the periodicity of the holes 121, namely, the spacing between adjacent holes 121, is "a", the radius of each hole 121 may be 0.1 a to 0.45 a, and the depth of each hole 121 may be 0.25λ/n to 10λ/n. Here, "λ" represents the wavelength of emitted light, and "n" represents the refractive index of the medium, at which the photonic crystal is formed, namely, the refractive index of the p-type semiconductor layer 113. Also, the periodicity "a" may be 200 nm to 5,000 nm.

Meanwhile, it may be possible to form the photonic crystal structure by forming regular rods, in place of the holes 121, as described above.

In order to form an n-type electrode 140 on the n-type semiconductor layer 111, an etching process may be performed for the semiconductor layer 110 such that the n-type semiconductor layer 111 is exposed at one side thereof. A p-type electrode 150 may be formed on a region where the light extracting layer 120 is formed.

The thickness of the material forming the light extracting layer 120 can be freely determined. The structure, in which a material having a high refractive index is deposited to form a photonic crystal, is applicable to any types of light emitting devices emitting red, green, or other colors.

Figure 30:
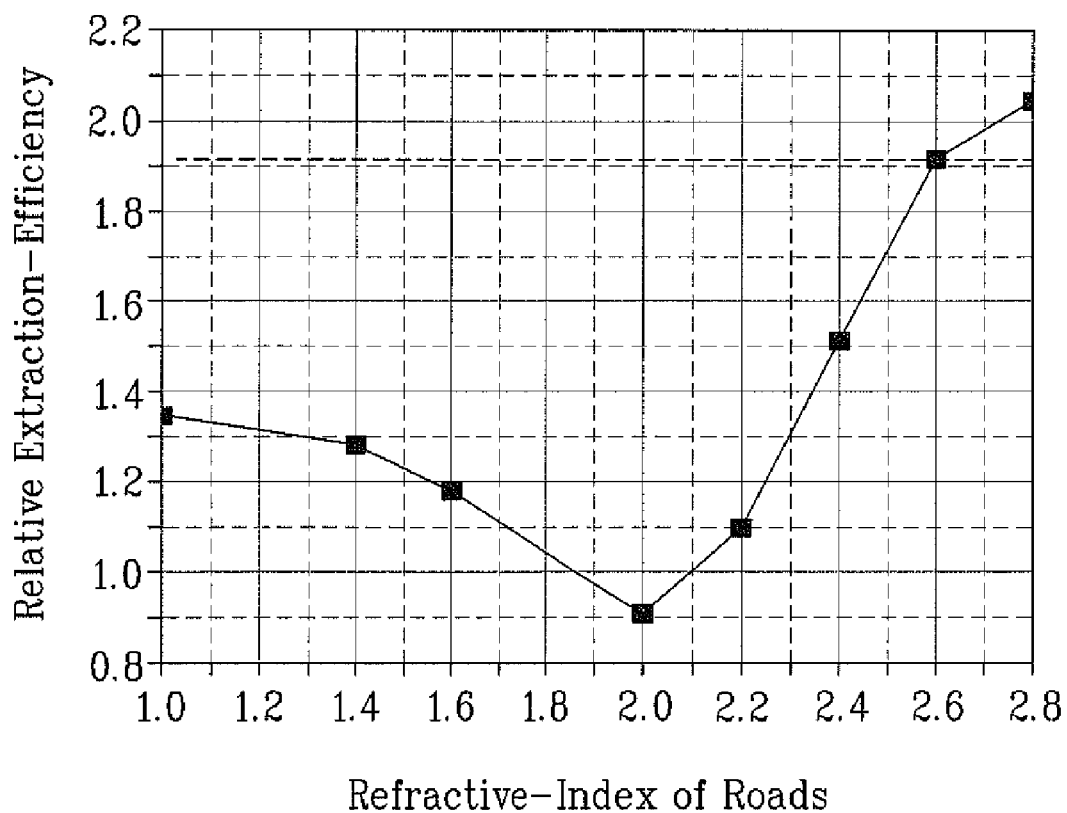

In order to identify the effects of the present invention, a variation in extraction efficiency depending on the refractive index of the light extracting layer 120 was measured for the structure according to the first embodiment, as shown in FIG. 30.

In the graph of FIG. 30, the vertical axis represents a relative enhancement in extraction efficiency in a general planar structure, in which no light extracting structure is introduced.

Referring to the results depicted in the graph, it can be seen that the extraction efficiency enhancement increases as the difference between the refractive index of the transparent conducting oxide 130 and the refractive index of the light extracting layer 120 increases. In FIG. 30, the broken line represents the extraction efficiency in the case in which the uppermost layer of the semiconductor layer (the p-type semiconductor layer in this case) is etched to form a photonic crystal.

When the refractive index of the light extracting layer 120 is in the vicinity of 2.6, an extraction efficiency enhancement similar to that of the case, in which the p-type GaN semiconductor layer is etched, is exhibited. When the light extracting layer 120 or photonic crystal is formed using a material having a higher refractive index, a superior extraction efficiency enhancement effect appears, as compared to the above-described photonic crystal structure formed in accordance with etching of the p-type semiconductor layer.

Therefore, the condition to be given to the light extracting layer 120 is that the light extracting layer 120 should have a refractive index similar to or higher than the refractive index of the semiconductor layer 20 (2.4), and should have a thickness of at least 150 nm (λ/n). If necessary, the thickness of the light extracting layer 120 may have a thickness of at least λ/4n.

Also, the material of the light extracting layer 120 should not cause absorption loss within the wavelength range of the light emitting layer in the light emitting device. The material of the light extracting layer 120 should also have an excellent physical bonding force.

For a material satisfying the above conditions, a silicon nitride ($Si_3N_4$) having a refractive index of about 2.4 or a titanium oxide ($TiO_2$) having a refractive index of 3.0 is preferred.

When the light extracting layer 120 is formed over the semiconductor layer 110, using a material having a refractive index similar to or higher than the refractive index of the semiconductor layer 110, as described above, it is possible to maintain desired electrical characteristics of the light emitting device while introducing a photonic crystal into the light emitting device, for an enhancement in extraction efficiency. Also, the same light extraction effect can be exhibited even for a higher current.

Moreover, it is possible to realize a light extraction effect equal to or superior to that of the case in which a GaN semiconductor layer is etched to form a photonic crystal and to increase the etching depth upon forming the photonic crystal to a level causing a saturation of the extraction efficiency.

Second Embodiment

Figure 31:
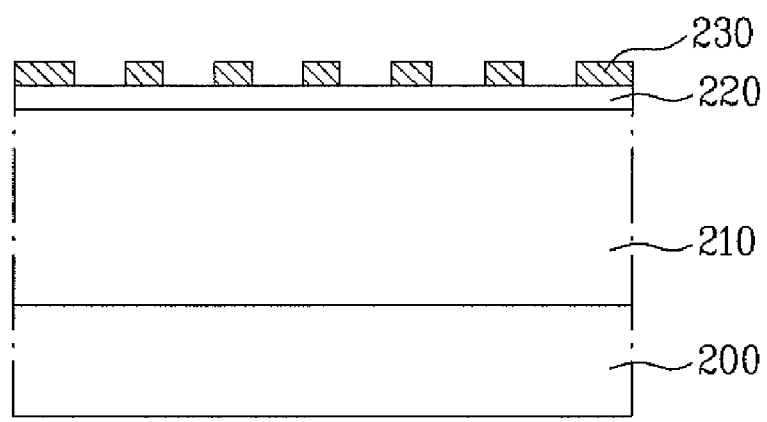

As shown in FIG. 31, a GaN-based semiconductor layer 201 is formed over a sapphire substrate 200 having a refractive index of 1.78. A transparent conducting layer 220 may be formed over the semiconductor layer 210. The transparent conducting layer 220 can be used as an electrode.

For the transparent conducting layer 220, indium tin oxide (ITO) may be used. Also, indium zinc oxide (IZO), aluminum zinc oxide (AZO), magnesium zinc oxide (MZO), or gallium zinc oxide (GZO) may be used.

A light extracting layer 230 is formed on the transparent conducting layer 220, using a material having a refractive index similar to or higher than the refractive index of the semiconductor layer 210.

The light extracting layer 230 may have a specific pattern. The specific pattern may form a photonic crystal having a periodic hole structure. The formation of such a photonic crystal may be achieved through an etching method or other patterning methods.

When the semiconductor layer 210 is a gallium nitride layer, the light extracting layer 230 may have a refractive index of about 2.4 or more because the refractive index of gallium nitride is 2.4. The refractive index of the light extracting layer 230 may also be slightly lower than 2.4. For the light extracting layer 230, an oxide or a nitride may also be used. In particular, SiN or $TiO_2$ may be used. Such matters may be identical to those of the first embodiment.

Figure 32:
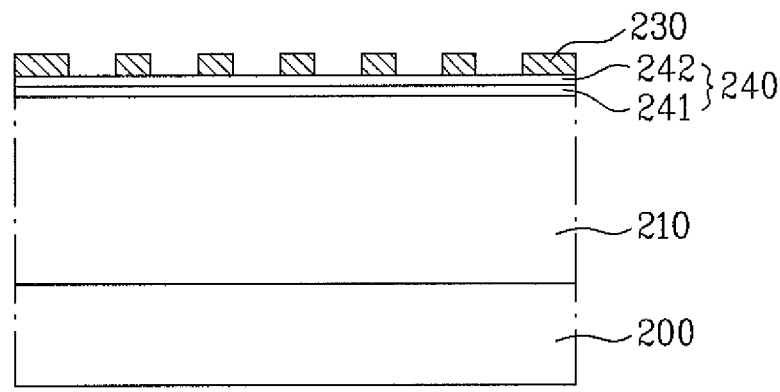

Meanwhile, as shown in FIG. 32, a thin transparent metal layer 240 consisting of, for example, an Ni layer 241 and an Au layer 242, may be used, in place of the transparent conducting layer 220. The transparent metal layer 240 is sufficiently thin to allow light to pass therethough.

Of course, the transparent metal layer 240 may be formed using an alloy containing Ni or Au.

Preferably, the transparent metal layer 240 has a thickness of several nanometers less than 10 nm. For example, the Ni layer 241 may have a thickness of 2 nm or less, and the Au layer 242 may have a thickness of 4 nm or less.

As described above, the transparent conducting layer 220 or transparent metal layer 240 may be formed over the semiconductor layer 210. Where the transparent conducting layer 220 is formed using a metal oxide, it is preferred that the thickness of the transparent conducting layer 220 be sufficiently small.

Figure 33:
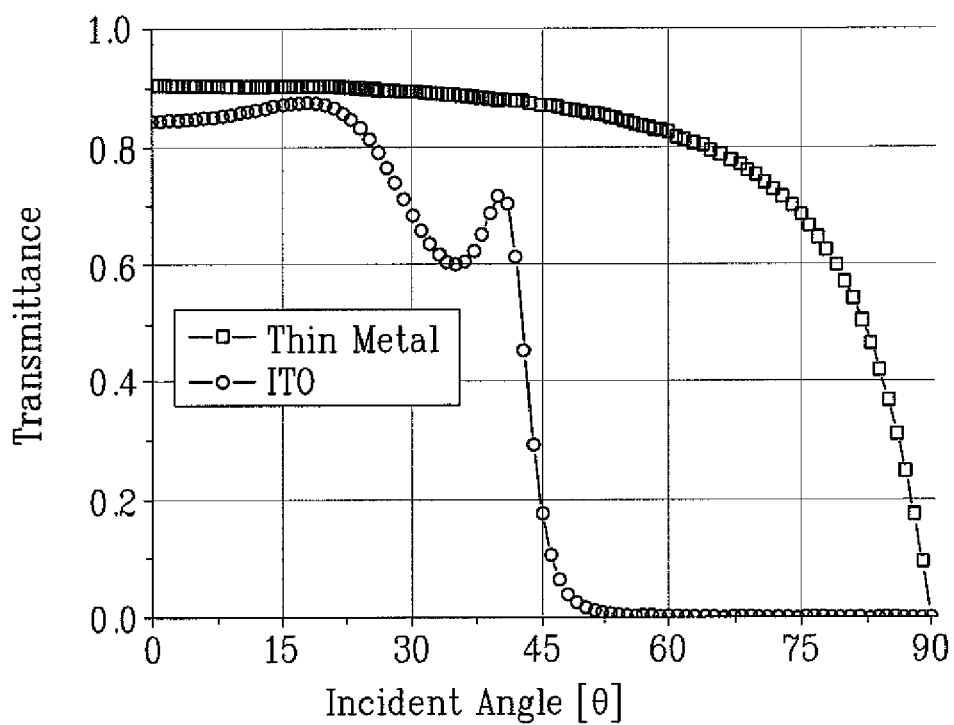

FIG. 33 illustrates the transmittance depending on the incidence angle of light for the transparent conducting layer 220, which is made of, for example, ITO, and the transparent metal layer 240. Referring to FIG. 33, it can be seen that, when ITO is used, a great reduction in transmittance occurs at an incidence angle larger than about 45°.

Figure 34:
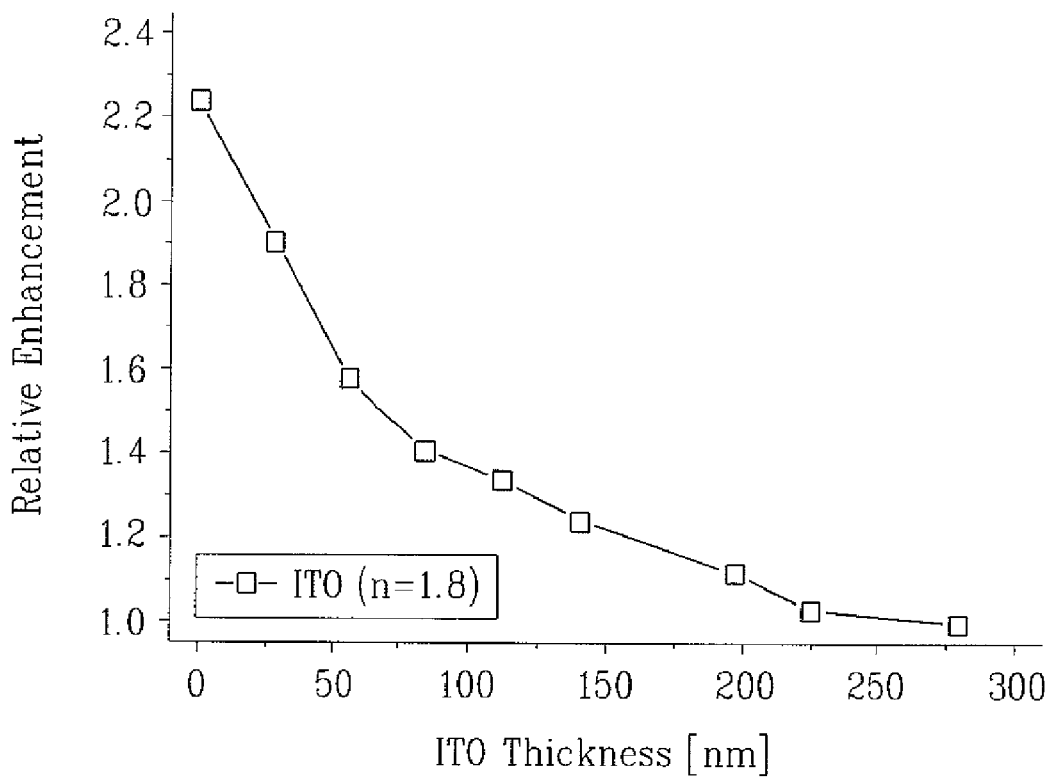

Also, referring to FIG. 34, it can be seen that the extraction efficiency enhancement obtained by the light extracting layer 230 is gradually reduced as the thickness of the ITO layer increases. Accordingly, when the light extracting layer 230 has a refractive index lower than that of the semiconductor layer 210, as described above, it is preferred that the thickness of the transparent conducting layer 220 be smaller than λ/2n ("λ" represents the wavelength of light, and "n" represents the refractive index of the transparent conducting layer).

Since the transparent conducting layer 220 can function as an electrode, it is more advantageous that the transparent conducting layer 220 has a thickness of λ/16n to λ/4n, when voltage characteristics are taken into consideration.

In the case of the transparent metal layer 240, it is possible to determine the thickness of the transparent metal layer 240 because a desired transmittance can be maintained at most angles, as shown in FIG. 33.

Figure 35:
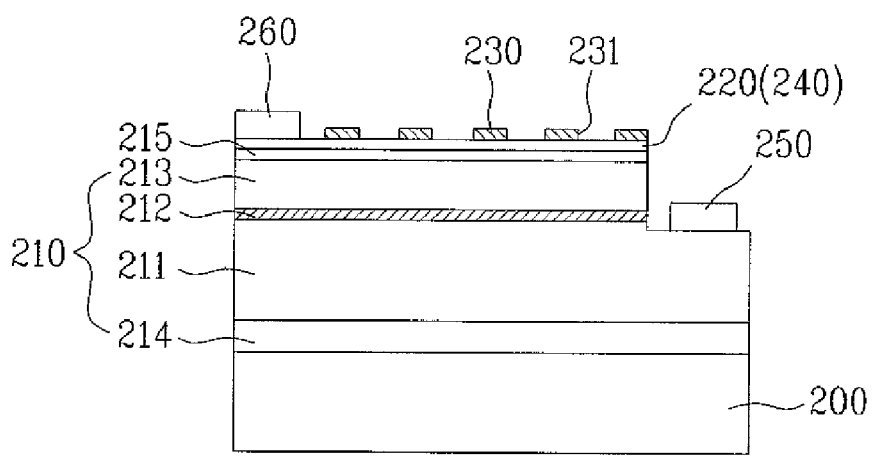

FIG. 35 illustrates a light emitting device having the above-described structure. In the illustrated case, the semiconductor layer 210 includes an n-type semiconductor layer 211 arranged on the sapphire substrate 200, a light emitting layer 212 arranged on the n-type semiconductor layer 211, and a p-type semiconductor layer 213 arranged on the light emitting layer 212. An undoped low-temperature buffer layer 214 may be interposed between the sapphire substrate 200 and the n-type semiconductor layer 211.

A current diffusion layer 215 having a thickness of several nanometers may be formed over the p-type semiconductor layer 213. The current diffusion layer 215 may be made of an undoped semiconductor layer.

In particular, for the current diffusion layer 215, an $In_xGa_{1-x}N$ layer or an $In_xGa_{1-x}N$/GaN superlattice layer may be used. The current diffusion layer 215 can function to enhance mobility of carriers, and thus to cause current to flow smoothly. In this regard, such a current diffusion layer is also called a current transport enhanced layer (CTEL).

The p-type semiconductor layer 213 may have a thickness of 30 to 500 nm. Also, the light extracting layer 230 may have a thickness of λ/4n or more. Here, "n" represents the refractive index of the material forming the light extracting layer 230.

Matters not described in association with this embodiment may be identical to those of the first embodiment.

Third Embodiment

Figure 36:
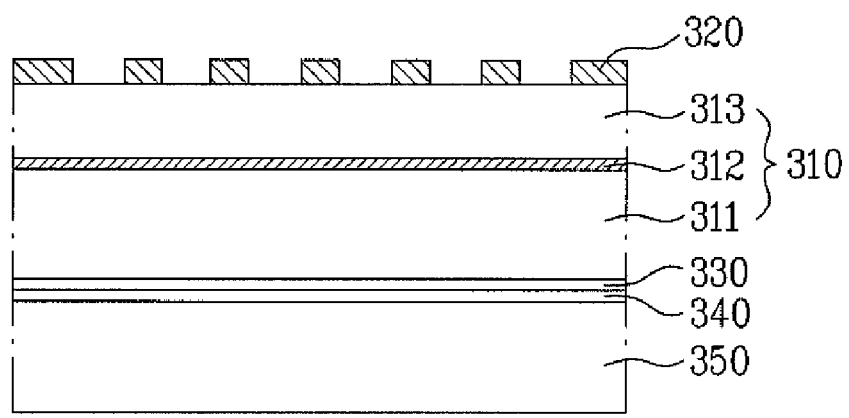
FIG. 36 is a sectional view illustrating a third embodiment of the present invention.

FIG. 36 illustrates an embodiment in which a light extracting layer 320 having a high refractive index is applied to the structure of a vertical light emitting device.

In this embodiment, the light extracting layer 320 is formed over a semiconductor layer 310, using a material having a refractive index similar to or higher than the refractive index of the semiconductor layer 310. The semiconductor layer 310 includes an n-type semiconductor layer 311, a light emitting layer 312 arranged on the n-type semiconductor layer 311, and a p-type semiconductor layer 313 arranged on the light emitting layer 312.

The light extracting layer 320 may have a specific pattern. The specific pattern may form a photonic crystal having a periodic structure. The formation of such a photonic crystal may be achieved through an etching method or other patterning methods.

For the formation of the photonic crystal structure, a positive lithography for forming holes or a negative lithography for forming rods is usable. This matter may be identical to that of the first embodiment.

As shown in FIG. 36, the semiconductor layer 310 may be formed over an electrode consisting of a transparent electrode 330 having ohmic characteristics and a reflective electrode 340. The transparent electrode 330 may be formed using a conducting oxide such as ITO, and the reflective electrode 340 may be formed using a metal such as Al or Ag.

The electrode may also consist of a single-layer reflective ohmic electrode (not show), in place of the multi-layer structure consisting of the transparent electrode 330 and refractive electrode 340.

The above-described structure may be arranged on a support layer 350 made of a metal or semiconductor layer. In this case, the support layer 350 can support the light emitting device structure in a procedure for removing a substrate, on which the semiconductor layer 310 has been grown, to obtain a vertical structure.

In this vertical light emitting device structure, an n-type electrode is formed on the light extracting layer 320 such that the n-type electrode is electrically connected to the n-type semiconductor layer 313. Thus, current flows vertically during operation of the light emitting device.

Fourth Embodiment

Figure 37:
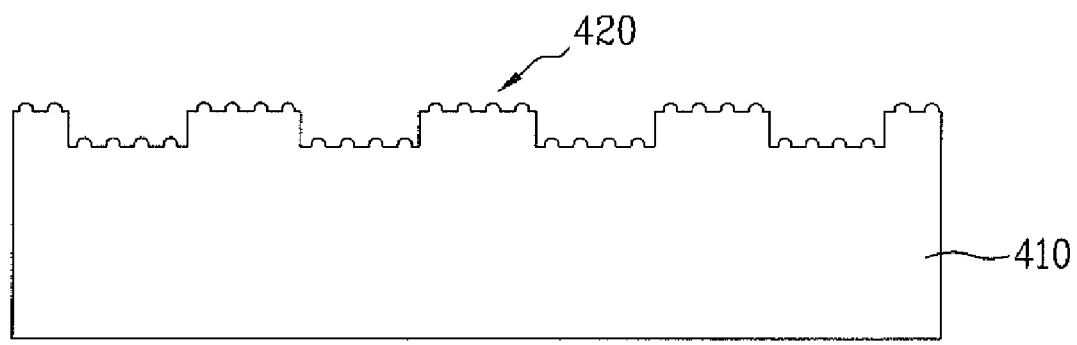
Figure 38:
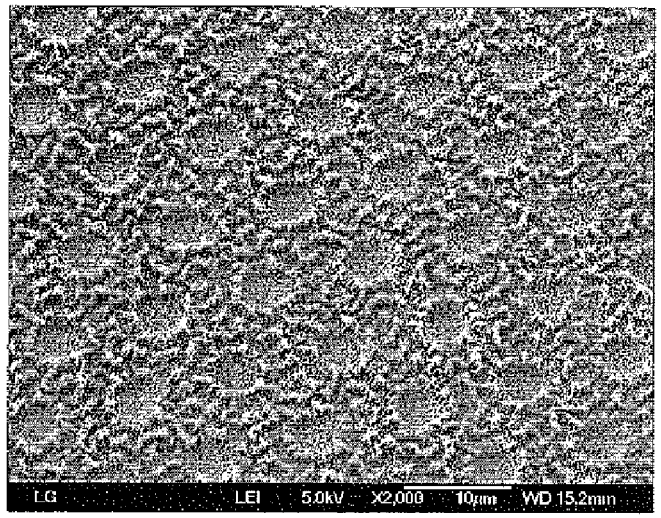
Figure 39:
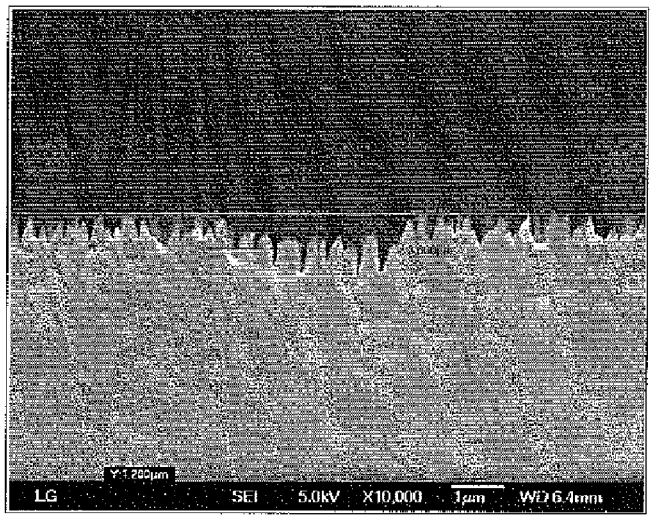

FIG. 37 illustrates the structure of a photonic crystal layer 420 in which photonic crystals having different periodicities are mixed. FIGS. 38 and 39 are electro-microscopic photographs of structures obtained when the photonic crystal layer 420 is experimentally implemented.

Referring to the electro-microscopic photographs, it can be seen that, when the surface of the n-type GaN semiconductor layer in the vertical structure is patterned in accordance with a general etching process, a fine pattern is additionally formed as the surface of the GaN semiconductor layer reacts with plasma of the gas used in the etching process.

The photonic crystal layer 420 formed in accordance with the above-described formation procedure has a periodicity-mixed structure including a periodic photonic crystal structure and an additional random structure having an average periodicity shorter than that of the periodic photonic crystal structure.

Figure 40:
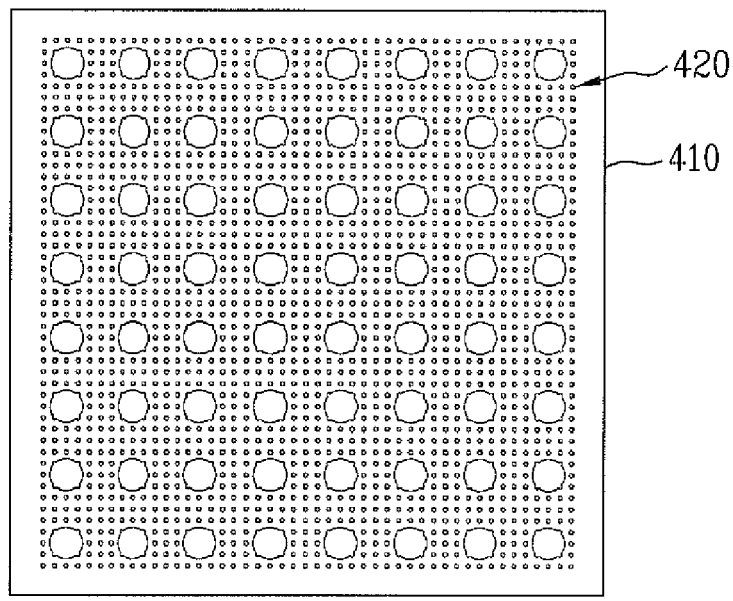
Figure 41:
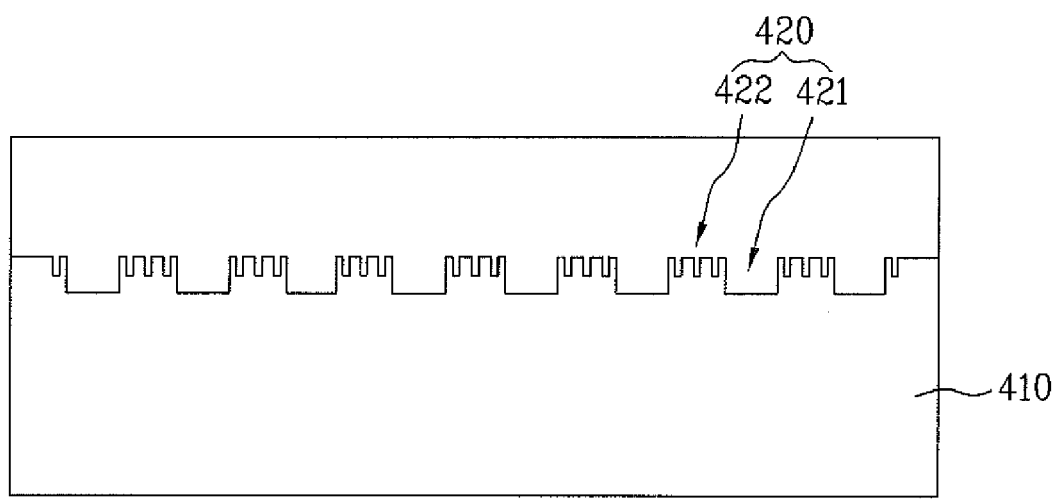

In order to arithmetically evaluate the effect of the periodicity-mixed structure of the photonic crystal layer 420, an extraction efficiency comparison was conducted for structures of FIGS. 40 and 41, through a calculation using a computer simulation.

The periodicity-mixed structure of the photonic crystal layer 420 may be variously expressed. However, for the simplification of the expression, the periodicity-mixed structure was expressed in accordance with the following principle.

First, the structure of a first photonic crystal 421 having a relatively long periodicity as a first periodicity was introduced. The etching depth of the structure of the first photonic crystal 421 was set to 450 nm.

The structure of a second photonic crystal 422 having a relatively short periodicity as a second periodicity was introduced into a portion of the long-periodicity structure of the first photonic crystal 421 which was not etched. The etching depth of the short-periodicity structure of the second photonic crystal 422 was set to 225 nm.

The structure expression was experimentally conducted in a calculation space in accordance with a method in which the second photonic crystal 422 having a short periodicity is first defined, and then the first photonic crystal 421 having a long periodicity is introduced.

In this case, the periodicity, etching depth, and shape of each structure of the mixed photonic crystals 421 and 422 may be variously expressed. Accordingly, various periodicity-mixed structures may be conceived for the photonic crystal layer 420 in accordance with various combinations of the above-described structural factors.

Figure 42:
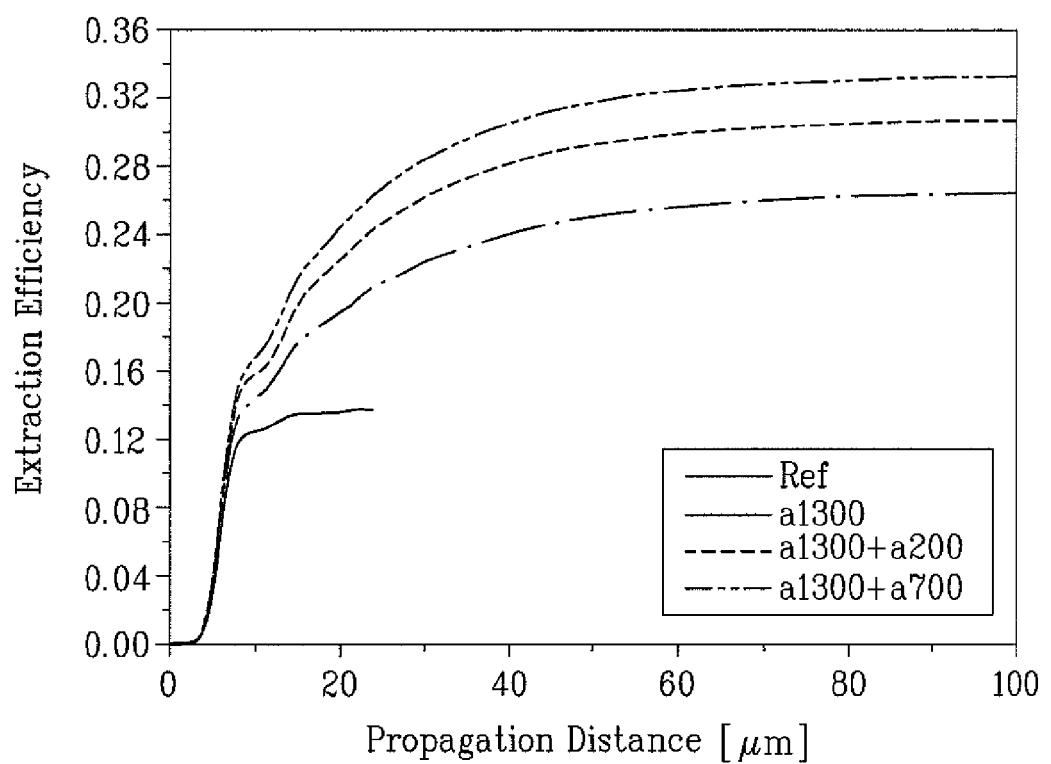

Referring to the results of the calculation, it can be seen that the photonic crystal structure, in which different periodicities are mixed, always exhibits a superior extraction efficiency enhancement effect, as compared to other structures, as shown in FIG. 42. Therefore, if a method capable of reliably manufacturing an experimental periodicity-mixed photonic crystal structure can be provided, it is possible to expect an extraction efficiency improved over that of a single photonic crystal structure, irrespective of a combination of photonic crystal structures.

As described above, when a photonic crystal is formed by etching an n-type GaN semiconductor layer having a thickness of 3 μm upon introducing the photonic crystal into a vertical GaN-based light emitting device, it is possible to maintain desired electrical characteristics, as compared to a horizontal structure, in which a photonic crystal is formed at a p-type GaN semiconductor layer. Also, there is no substantial limitation on etching depth.

The extraction efficiency enhancement effect depending on the etching depth in a photonic structure having a single periodicity can be summarized as follows. That is, when the etching depth of the photonic crystal introduced into the n-type GaN semiconductor layer is 300 nm or more, and the periodicity of the introduced photonic crystal is 1 μm or more, but less than 5 μm, the photonic structure, which satisfies the above two conditions, exhibit a tendency that that the extraction efficiency approaches a maximum extraction efficiency while increasing continuously in proportion to the etching depth.

As the etching depth increase, the optimal periodicity is shifted to a longer-periodicity direction. For example, the optimal photonic crystal periodicity is in the vicinity of 800 nm at an etching depth of 225 nm, but is 1,400 nm at an etching depth of 900 nm.

When there is no substantial limitation on etching depth, various periodicity-mixed photonic crystal structures can be proposed. The shape of the periodicity-mixed photonic crystal structure may be classified, in accordance with the manufacturing method thereof, as follows.

Figure 43:
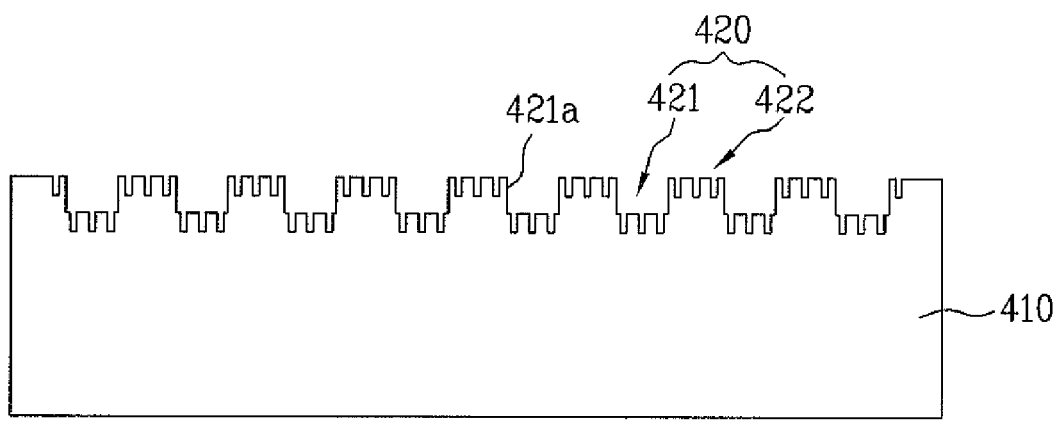

As shown in FIG. 43, the periodicity-mixed photonic crystal layer 420 may be formed over the semiconductor layer 410 by forming the first photonic crystal 421, which has a relatively long periodicity, in accordance with an etching process, and then forming the second photonic crystal 422, which has a relatively short periodicity, in accordance with an etching process. In this case, the second photonic crystal 422 has a random structure having an average periodicity shorter than the periodicity of the first photonic crystal 421.

When the short-periodicity second photonic crystal 422 is formed after the formation of the long-periodicity first photonic crystal 421, as described above, the second photonic crystal 422 is also formed in holes 421a forming the first photonic crystal 421. Thus, the second crystal 422 can be present in the overall portion of the light emitting surface.

The periodicity of the first photonic crystal 421 corresponding to the longest periodicity of the photonic crystal layer 420 may be 800 to 5,000 nm. The depth of a pattern forming the first photonic crystal 421, which has a periodicity corresponding to the longest periodicity of the photonic crystal layer 420, may be 300 to 3,000 nm.

The periodicity of the second photonic crystal 422 corresponding to the shortest periodicity of the photonic crystal layer 420 may be 50 to 1,000 nm. The depth of a pattern forming the second photonic crystal 422, which has a periodicity corresponding to the shortest periodicity of the photonic crystal layer 420, may be 50 to 500 nm.

Meanwhile, when it is assumed that the periodicity of the photonic crystal layer 420 is "a", the depth of holes forming the photonic crystals of the photonic crystal layer 420 may be 0.1 a to 0.45 a.

Figure 44:
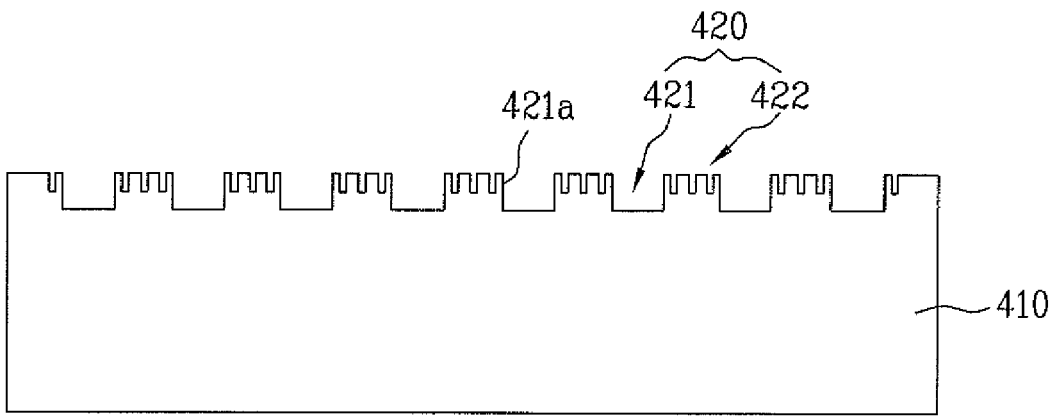

FIG. 44 illustrates a structure of the periodicity-mixed photonic crystal layer 420 formed over the semiconductor layer 410, in which the second photonic crystal 422, which has a relatively short periodicity, in accordance with an etching process, and then the first photonic crystal 421, which has a relatively long periodicity, is formed in accordance with an etching process.

Figure 45:
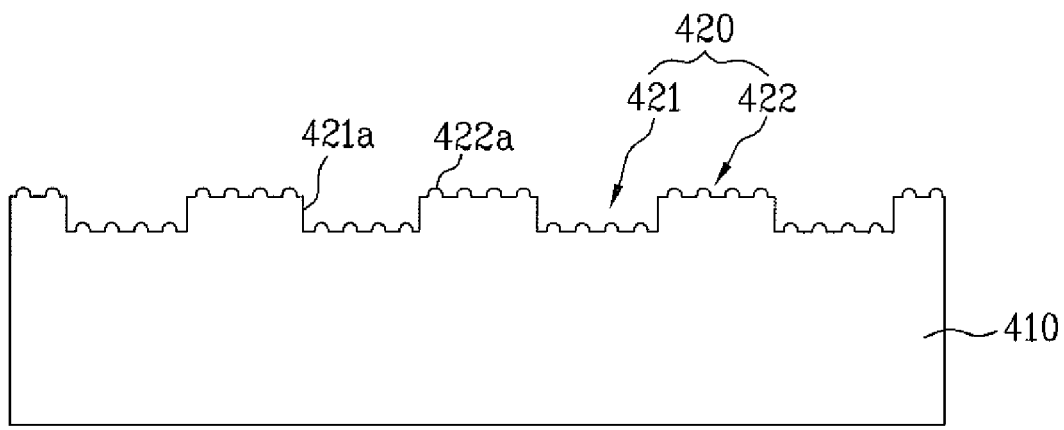

Alternatively, as shown in FIG. 45, the first photonic crystal 421, which has a relatively long periodicity, may be first formed in accordance with an etching process, and then the second photonic crystal 422, which has a relatively short periodicity, may be formed in accordance with a deposition process.

When the second photonic crystal 422 is formed in accordance with a deposition process, it has a pattern of particles 422a protruded from the structure of the first photonic crystal 421, in place of an engraving pattern. The particles 422a may have a hemispherical shape. The particles 422a may also have a hexagonal structure in accordance with the shape of GaN crystals.

When the short-periodicity second photonic crystal 422 is formed after the formation of the long-periodicity first photonic crystal 421, as described above, the second photonic crystal 422 is also formed in holes 421a forming the first photonic crystal 421. Thus, the second crystal 422 can be present in the overall portion of the light emitting surface.

Figure 46:
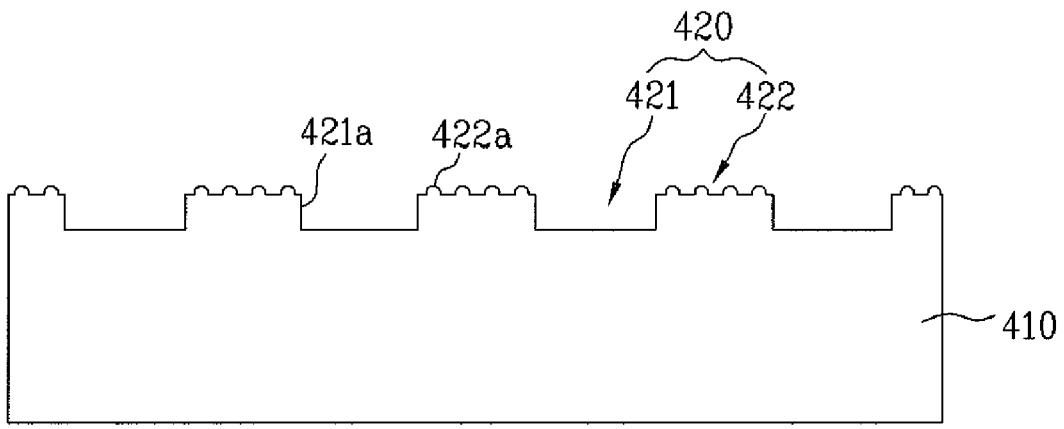

FIG. 46 illustrates a structure in which the second photonic crystal 422, which has a relatively short periodicity, in accordance with a deposition process, and then the first photonic crystal 421, which has a relatively long periodicity, is formed in accordance with an etching process.

Since the above-described periodicity-mixed photonic crystal layer 420 has a structure including photonic crystals 421 and 422 having different periodicities, various periodicity-mixed structures may be conceived for the photonic crystal layer 420 in accordance with various combinations of the structural factors of the photonic crystals 421 and 422.

Basically, the extraction efficiency depends on a combination of the periodicities of the two photonic crystals 421 and 422. In this case, the etching depth, photonic crystal shape, etc. may function as parameters. When a new material is introduced due to the deposition process, the refractive index of the introduced material may also function as a parameter.

When a photonic crystal is introduced into an n-type GaN semiconductor layer in a vertical GaN-based light emitting device, for an enhancement in external extraction efficiency, it is possible to secure a maximum extraction efficiency in a long-periodicity structure (1μm), which is easily manufactured, by deeply etching the photonic crystal in accordance with the present invention.

In accordance with the present invention, it is possible to maximize the extraction efficiency enhancement by providing a periodicity-mixed photonic crystal structure, in which two or more periodicities are mixed on the same plane, as an extension from a photonic crystal structure having a single periodicity.

Figure 47:
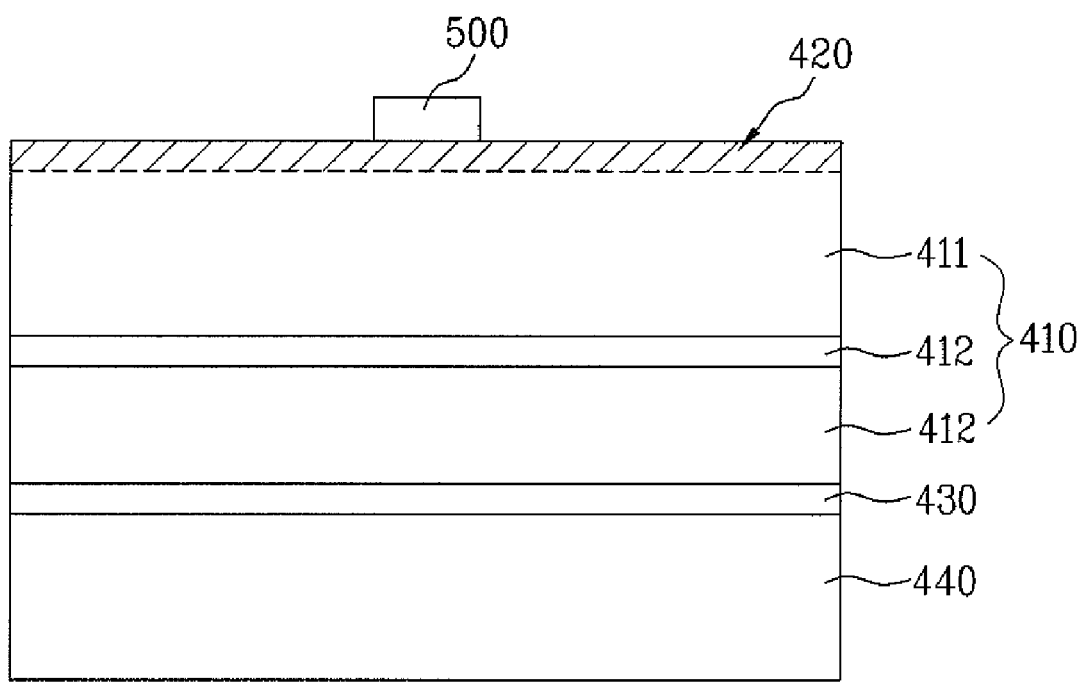

FIG. 47 illustrates the structure of a vertical light emitting device which includes the above-described periodicity-mixed photonic crystal layer 420.

The semiconductor layer 410, in which the above-described photonic crystal structure is formed, includes an n-type semiconductor layer 411, a light emitting layer 412, and a p-type semiconductor layer 413 which are arranged in this order. As described above, the photonic crystal layer 420 is formed on the n-type semiconductor layer 411.

An ohmic electrode layer or reflective ohmic electrode layer 430 may be arranged beneath the semiconductor layer 410. The above-described light emitting device structure may be arranged on a support layer 440 made of a semiconductor such as silicon or a metal.

An n-type electrode 450 may be arranged on the n-type semiconductor layer 411 formed with the photonic crystal layer 420.

The above-described structure has a feature in that the photonic crystal has no or little effect to cause an increase in resistance in the semiconductor layer 410 because it is formed in accordance with etching of the n-type GaN semiconductor layer 411. Also, the light extraction effect obtained in accordance with the introduction of the photonic crystal layer 420 can be equally maintained even in a high-power output region because the vertical GaN-based light emitting device can easily discharge heat.

Meanwhile, since the thickness of the n-type GaN semiconductor layer 411 can generally be larger than 3 μm, the etching depth of the photonic crystal can be increased to be considerably larger than the etching depth at which the extraction efficiency is saturated.

As the etching depth of the photonic crystal increases as described above, the periodicity capable of securing a maximum extraction efficiency is shifted in a longer-periodicity direction. In particular, the photonic crystal, which has a periodicity of 1 μm or more, can continuously increase the extraction efficiency for an etching depth larger than an etching depth at which the extraction efficiency is saturated when a photonic crystal having a shorter periodicity is used.

Meanwhile, the structure of the periodicity-mixed photonic crystal layer 420, in which different periodicities are mixed in the same plane, as described above, can exhibit a superior extraction efficiency enhancement, irrespective of the combination of photonic crystals, as compared to the structure having a single periodicity. Also, the shift of the optimal periodicity depending on the etching depth and the structure of the periodicity-mixed photonic crystal layer 420 are applicable to other light emitting device structures in which the thickness of a photonic crystal forming layer is 300 nm or more.

Fifth Embodiment

Figure 48:
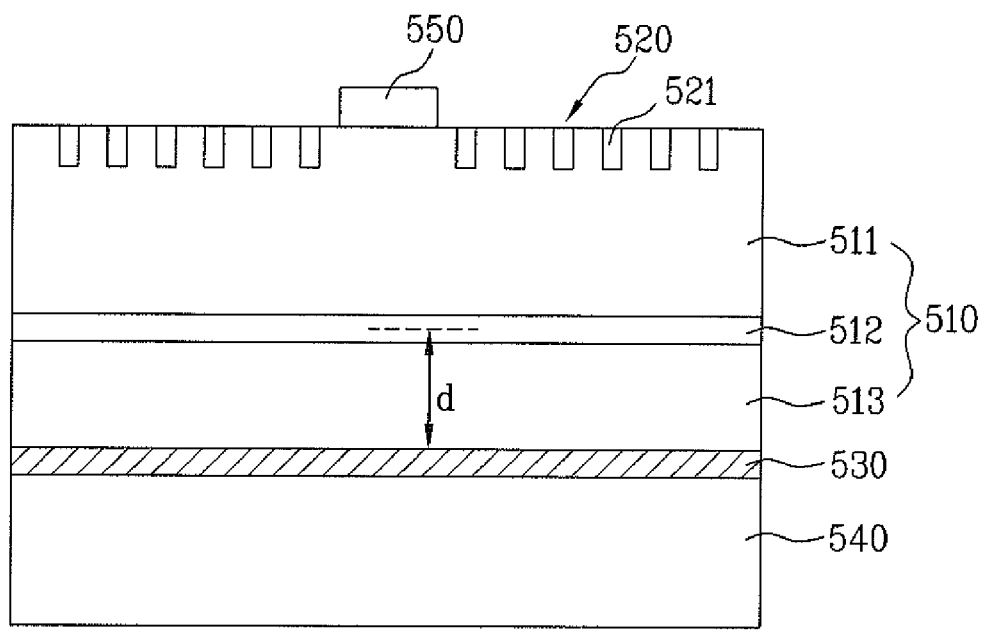

FIG. 48 illustrates the structure of a light emitting device which is capable of maximizing the extraction efficiency, taking into consideration the effect of a photonic crystal exhibited when the gap between a mirror and a light emitting layer falls under a reinforced interference condition.

In the illustrated light emitting device structure, a reflective electrode 530 is arranged on a support layer 540, and a semiconductor layer 510 is arranged on the reflective electrode 530. For the reflective electrode 530, a material capable of making an ohmic contact with the semiconductor layer 510 may be used. Preferably, the reflective electrode 530 has a reflectance of 50% or more.

Figure 49:
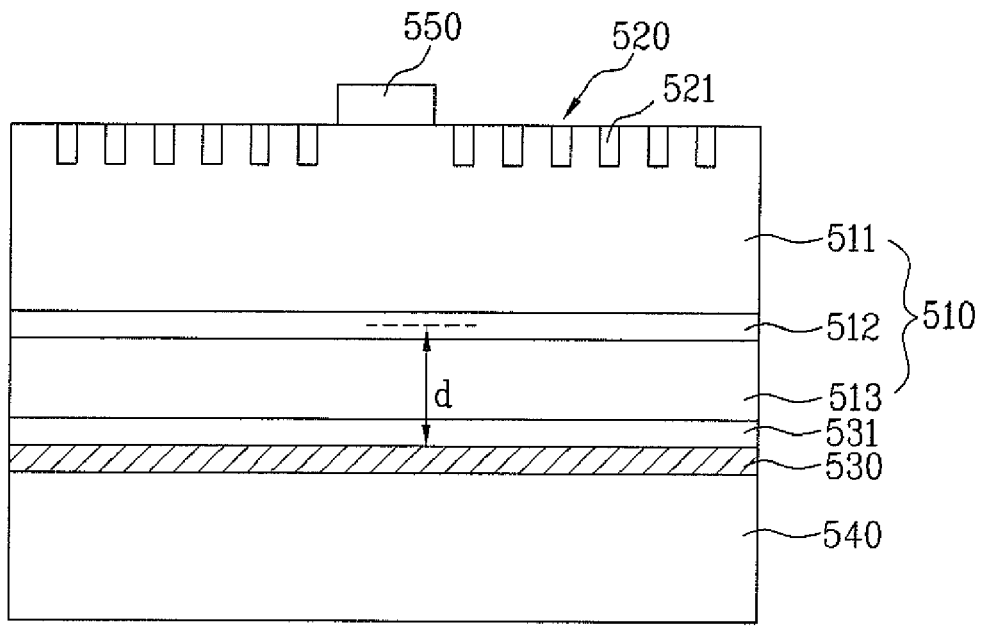

As shown in FIG. 49, a separate ohmic electrode 531 may be interposed between the reflective electrode 530 and the semiconductor layer 510. In this case, for the ohmic electrode 531, a transparent electrode may be used. For the transparent electrode, indium tin oxide (ITO) having a low refractive index may be used. Also, indium zinc oxide (IZO), aluminum zinc oxide (AZO), magnesium zinc oxide (MZO), or gallium zinc oxide (GZO) may be used.

As shown in FIG. 48 or 49, the semiconductor layer 510 includes a p-type semiconductor layer 513, a light emitting layer 532 arranged on the p-type semiconductor layer 513, and an n-type semiconductor layer 511 arranged on the light emitting layer 512.

A photonic crystal 520, which consists of a pattern including a plurality of holes 521 or rods, may be arranged on the n-type semiconductor layer 511. An n-type electrode 550 is arranged on a portion of the n-type semiconductor layer 511. The pattern of the photonic crystal 520 may not be formed on a region where the n-type electrode 550 is arranged.

In the photonic crystal 520, the depth of each hole 521 or the height of each rod may be 300 to 3,000 nm. The photonic crystal 520 may have a periodicity of 0.8 to 5 μm. When it is assumed that the periodicity of the photonic crystal 520 is "a", the size (diameter) of each hole 521 or each rod may be 0.25 to 0.45 a.

As described above, the distance "d" between the reflective electrode 530 and the center of the light emitting layer 512 may be $0.65\lambda/n$ to $0.85\lambda/n$, or may be an odd multiple of $\lambda/4n$.

The distance between the reflective electrode 530 and the light emitting layer 512 may be adjusted consequently by the p-type semiconductor layer 513. That is, it is possible to establish a reinforced interference condition in a light extraction procedure by adjusting the distance between the reflective electrode 530 and the light emitting layer 512.

When a separate transparent ohmic electrode 531 made of a material such as ITO is interposed between the reflective electrode 530 and the light emitting layer 512, it is possible to more easily carry out the procedure for adjusting the thickness of the p-type semiconductor layer 513 to fall under the reinforced interference condition.

Figure 50:
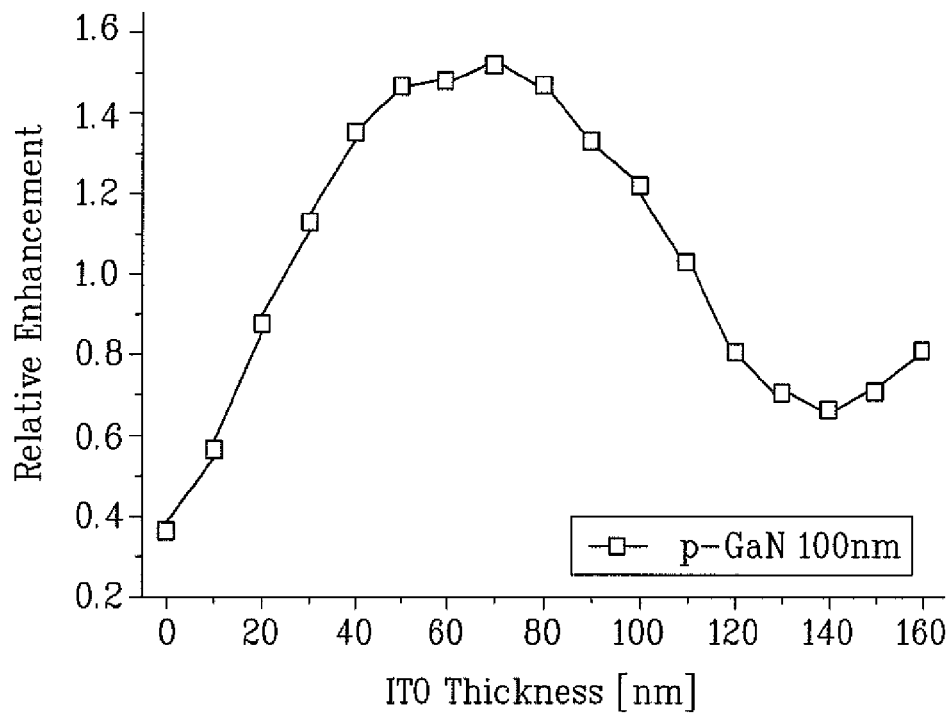
Figure 51:
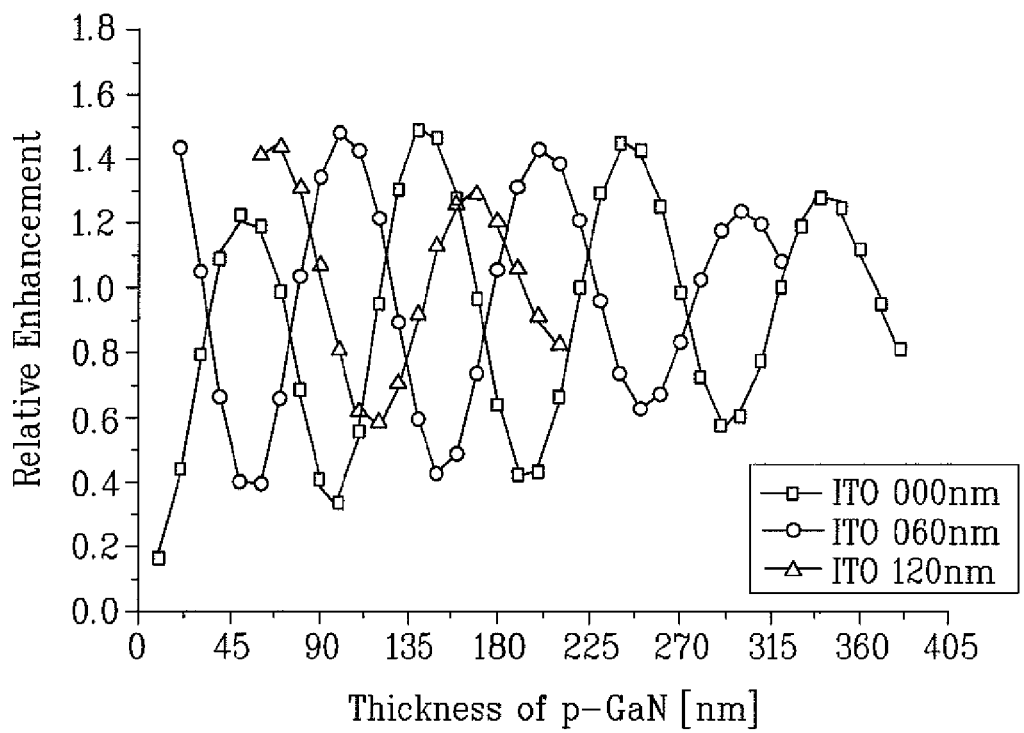

FIG. 50 depicts the extraction efficiency depending on the thickness of the ohmic electrode 531 when ITO is used for the ohmic electrode 531 in the structure of FIG. 49, using a graph. FIG. 51 depicts a variation in extraction efficiency depending on a variation in the thickness of the p-type semiconductor layer 513 in the structure of FIG. 49.

Referring to FIGS. 50 and 51, it can be seen that the extraction efficiency control can be more easily achieved by adjusting the thickness of the transparent ohmic electrode 531. This means that it is possible to more easily adjust the reinforced interference condition for light extraction by controlling the thickness of the ohmic electrode 531.

In accordance with the present invention, when the photonic crystal 520 is introduced into the n-type semiconductor layer 511 of the vertical GaN-based light emitting device, in order to achieve an enhancement in external extraction efficiency, it is possible to obtain a maximum extraction efficiency under the condition in which the photonic crystal 520 has a long periodicity (1 μm or more) such that it is easily manufactured, using the interference effect of the reflective electrode 530 and the etching depth. Also, it is possible to obtain an enhancement in extraction efficiency, using only the interference effect of the reflective electrode 530.

When the above-described light emitting device structure is packaged, it can exhibit a high extraction efficiency, irrespective of the structure of the package.

Figure 52:
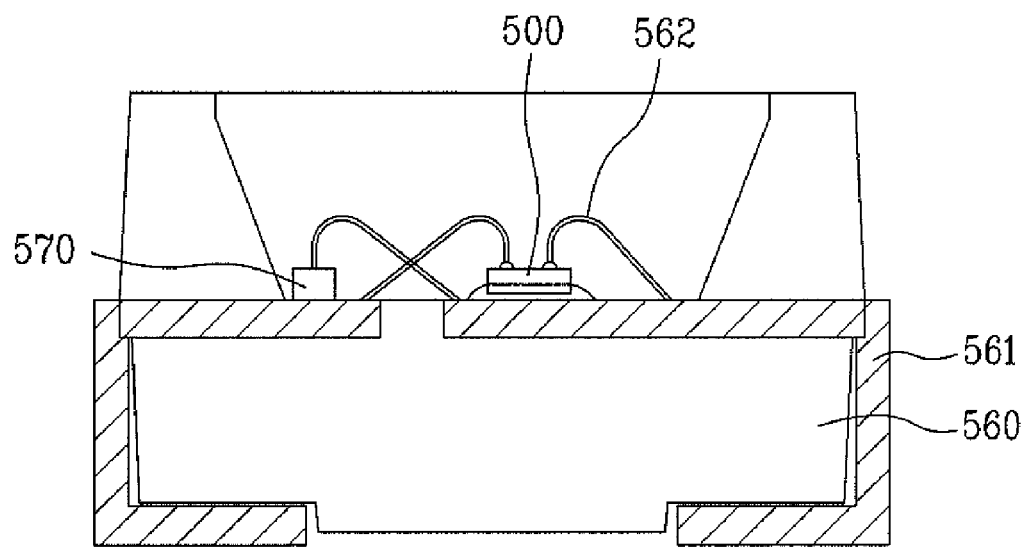

FIG. 52 illustrates a package structure in which leads 561 are formed around a package body 560, and a light emitting device 500 having the above-described features is mounted on the top of the package body 560. The light emitting device 500 may be connected to the leads 561 via wires 562. A zener diode 570 is arranged at one side of the light emitting device 500, to achieve an improvement in withstanding voltage characteristics.

The package body 560, on which the light emitting device 500 is mounted, is encapsulated with a planar encapsulate.

Figure 53:
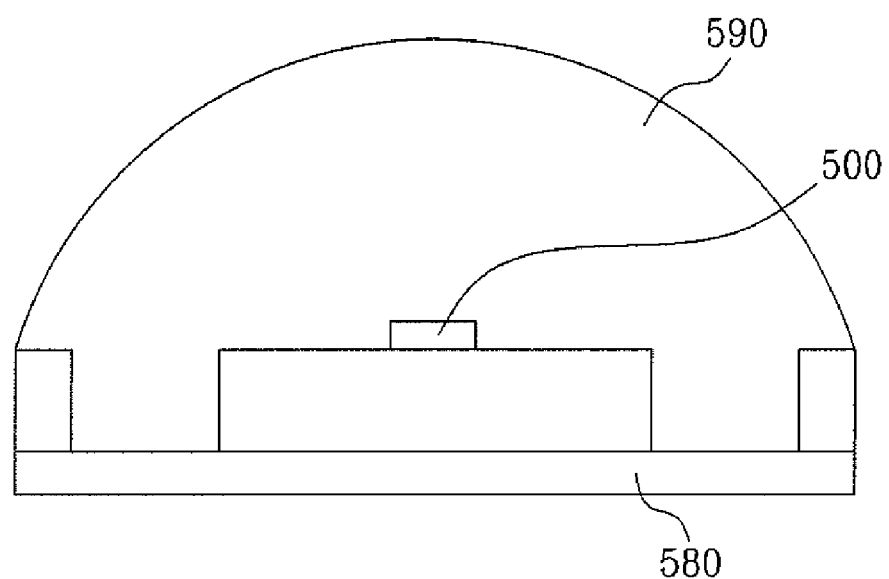

FIG. 53 illustrates a structure in which the light emitting device 500 is mounted on a package body 580, and a dome-shaped encapsulate 590 is formed.

Light emitted from the above-described light emitting device 500 while having a strong directionality in a vertical direction can exhibit substantially-equal power characteristics in the planar package structure of FIG. 52 and the dome-shaped package structure of FIG. 53.

Sixth Embodiment

Hereinafter, a procedure for manufacturing a light emitting device having a light extracting structure, such as a photonic crystal, in accordance with the present invention will be described.

Figure 54:
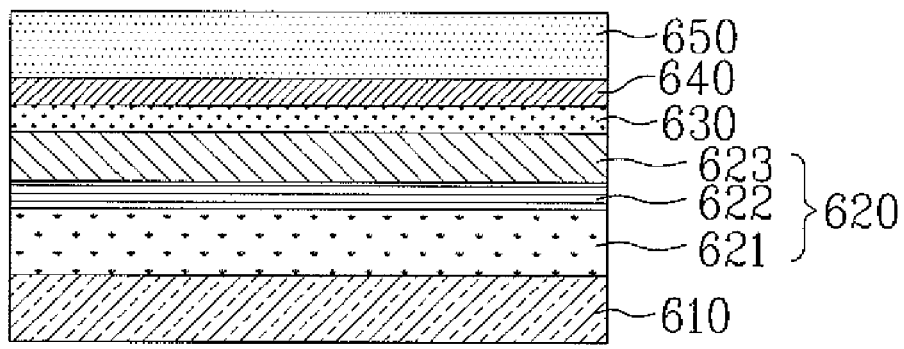

FIG. 54 illustrates an LED structure 600 formed on a substrate 610.

For the formation of the LED structure 600, a compound semiconductor layer 620 is first formed over the substrate 610 which is made of, for example, sapphire. The semiconductor layer 620 includes an n-type semiconductor layer 621, an active layer 622, and a p-type semiconductor layer 623 which are arranged, in this order, starting from the side of the substrate 610.

The arrangement order of the n-type semiconductor layer 621, active layer 622, and p-type semiconductor layer 623 may be reversed. That is, these layers may be formed over the substrate 610 in the order of the p-type semiconductor layer 623, the active layer 622, and the n-type semiconductor layer 621.

In particular, for the semiconductor layer 620, a GaN-based semiconductor may be used. In this case, the active layer 622 may have an InGaN/GaN quantum well (QW) structure. Also, a material such as AlGaN or AlInGaN may be used for the active layer 622. when an electric field is applied to the active layer 622, light is generated in accordance with coupling of electron-hole pairs.

In order to achieve an enhancement in brightness, the active layer 622 may have a multi-quantum well (MQW) structure including a plurality of QW structures as described above.

A p-type electrode 630 is formed over the semiconductor layer 620. The p-type electrode 630 is an ohmic electrode. A reflective electrode 640 may be formed over the p-type electrode 630, to reflect light generated from the active layer 622, and thus, to externally emit the generated light.

In place of the p-type electrode 630 and reflective electrode 640, a single electrode may be formed by appropriately selecting the materials of the p-type electrode 630 and reflective material 640, to function as both the p-type electrode 630 and the reflective electrode 640.

A support layer 650 may be formed over the reflective electrode 640, to support the LED structure 600 in a subsequent procedure for separating the substrate 610.

The support layer 650 may be formed by bonding a semiconductor substrate made of silicon (Si), gallium arsenide (GaAs), or germanium (Ge) or a metal substrate made of CuW to an upper surface of the reflective electrode 640. Alternatively, the support layer 650 may be formed by plating a metal such as nickel (Ni) or copper (Cu) over the reflective electrode 640.

Where the support layer 650 is made of a metal, it may be formed using a seed metal, in order to enhance the bondability to the reflective electrode 640.

Figure 55:
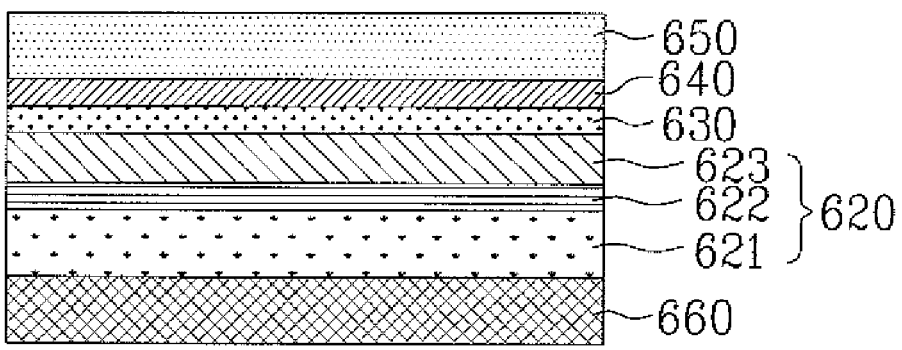

In accordance with the above-described processes, the LED structure 600 has a structure as shown in FIG. 54. From this structure, the substrate 610 is then removed. Thereafter, a dielectric layer 660 is formed over the surface, from which the substrate 610 has been removed. Thus, a structure as shown in FIG. 55 is obtained.

The removal of the substrate 610 may be achieved in accordance with a laser lift-off process using a laser. Alternatively, the substrate 610 may be removed in accordance with a chemical method such as an etching method.

During the procedure for removing the substrate 610, the support layer 650 supports the LED structure 600.

As described above, the dielectric layer 660 is formed over the n-type semiconductor layer 621 exposed in accordance with the removal of the substrate 610. For the dielectric layer 660, an oxide or a nitride may be used. For example, a silicon oxide ($SiO_2$) may be used.

A plurality of regular holes 661 are formed in the dielectric layer 660. The formation of the holes 661 may be achieved using a dry etching process such as a reactive ion etching (RIE) process or an inductively-coupled plasma reactive ion etching (ICP-RIE) process.

The dry etching process is suitable for the formation of the holes 661 because uni-directional etching can be achieved, different from a wet etching process. That is, although isotropic etching is carried out in the wet etching process such that etching is achieved in all directions, etching only in a depth direction for formation of the holes 661 can be achieved in accordance with the dry etching process. Accordingly, the holes 661 can be formed to have a desired pattern in terms of size and spacing, in accordance with the dry etching process.

Figure 56:
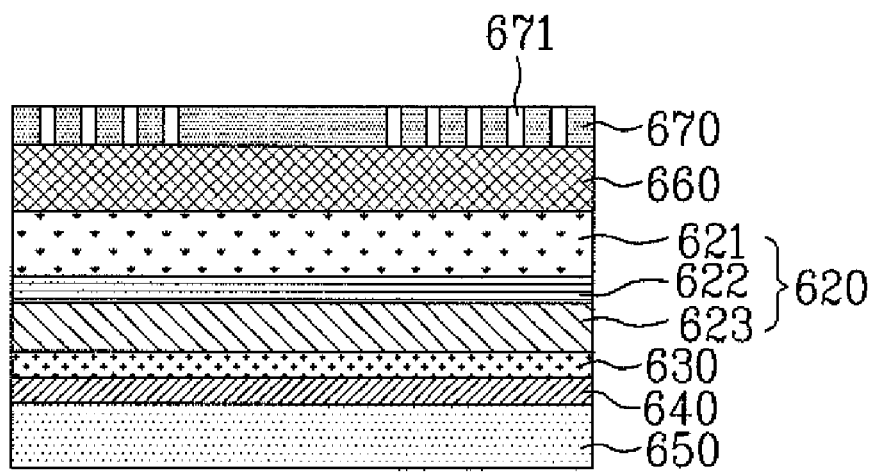

In order to form the multiple holes 661 as described above, a pattern mask 670 formed with a hole pattern 671 as shown in FIG. 56 may be used.

For the pattern mask 670, a metal mask made of, for example, chromium (Cr), may be used. If necessary, photoresist may be used.

Where photoresist is used for the pattern mask 670, the hole pattern 671 may be formed using a photolithography, an e-beam lithography, nano-imprinted lithography, or the like. In this procedure, a dry etching process or a wet etching process may be used.

Where a chromium mask is used for the pattern mask 670, a polymer layer is first formed a chromium layer, to form a pattern on the chromium layer. A pattern is then formed over the polymer layer in accordance with an imprinting method. Thereafter, the chromium layer is etched. Thus, the pattern mask 670 is formed. The etching of the chromium layer is achieved using a dry etching process.

For the dry etching process, an RIE process or an ICP-RIE process may be used. For the gas used in this process, at least one of $Cl_2$ and $O_2$ may be used.

Preferably, the hole pattern 671 is not formed in a certain region, to provide an empty space where n-type electrode pads 691 (FIG. 66) will be formed.

Figure 57:
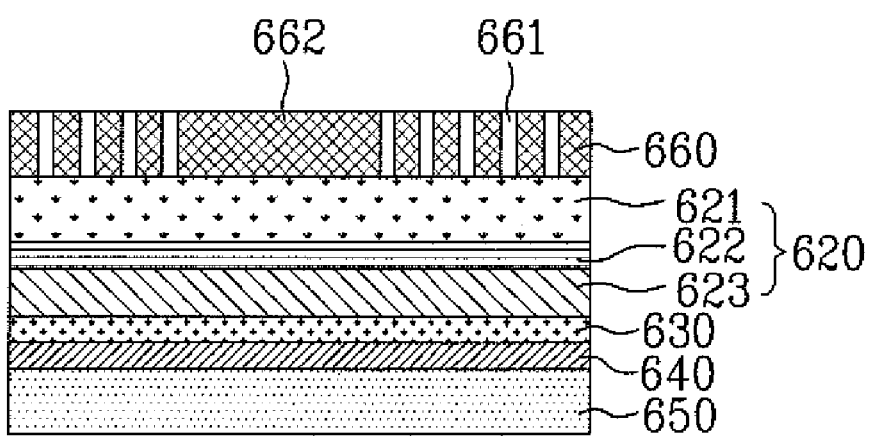

Through the above-described procedure, a plurality of holes 661 having the same pattern as the hole pattern 671 are formed in the dielectric layer 660, as shown in FIG. 57. In this case, the holes 661 extend throughout the dielectric layer 660.

The holes 661 may have various patterns. For example, the holes 661 have a square pattern. Also, the holes 661 may have various patterns as shown in FIGS. 58 to 62.

Figure 58:
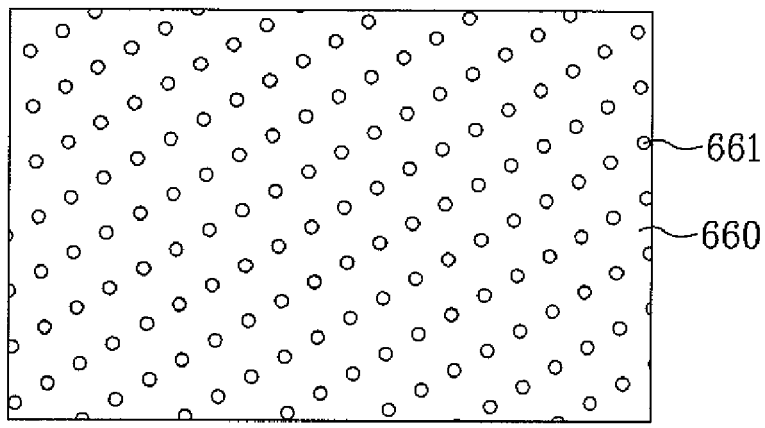
Figure 59:
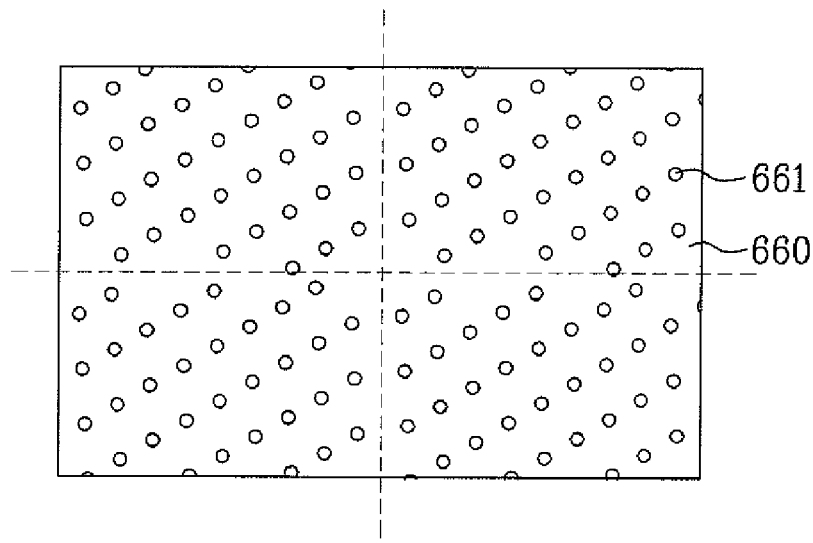

That is, the holes 661 are formed to be arranged along oblique lines defined in a light emitting device package, as show in FIG. 58. Also, the holes 661 may be formed to be arranged along oblique lines defined in a plurality of divided surface regions in a light emitting device package, as shown in FIG. 59. In this case, the oblique-line pattern of each surface region may not meet those of the remaining surface regions.

Figure 60:
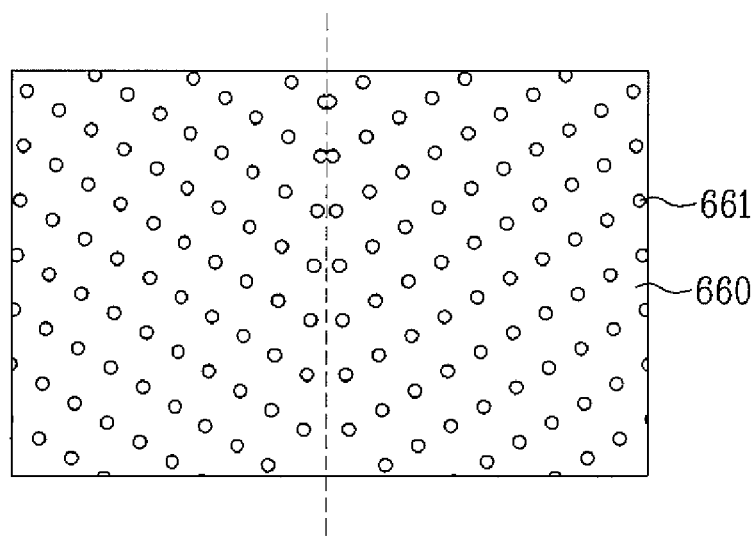
Figure 61:
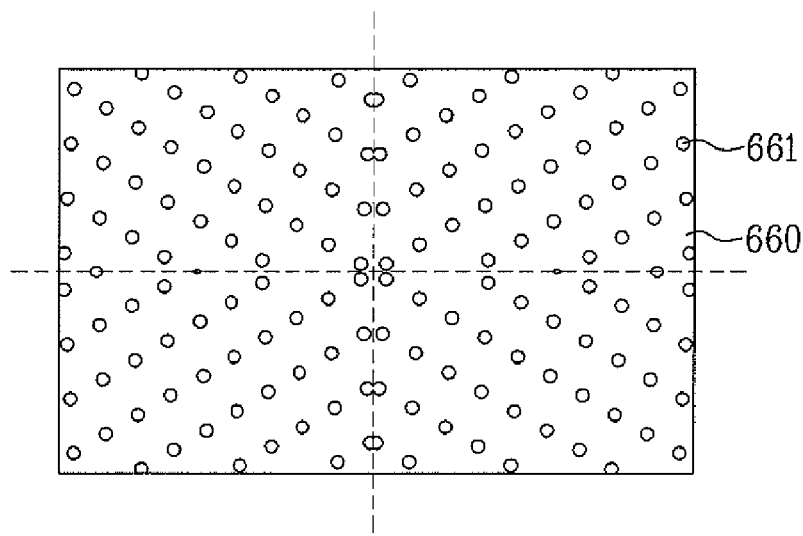

Alternatively, the oblique-line pattern of each region may meet those of the remaining regions, as shown in FIGS. 60 and 61. FIG. 60 illustrates the case in which the holes 661 are arranged along oblique lines defined in two divided regions of a light emitting device such that the oblique-line patterns meet at the boundary of the regions. FIG. 61 illustrates the case in which the holes 661 are arranged along oblique lines defined in four divided regions of a light emitting device such that the oblique-line patterns meet at the boundaries of the regions.

Figure 62:
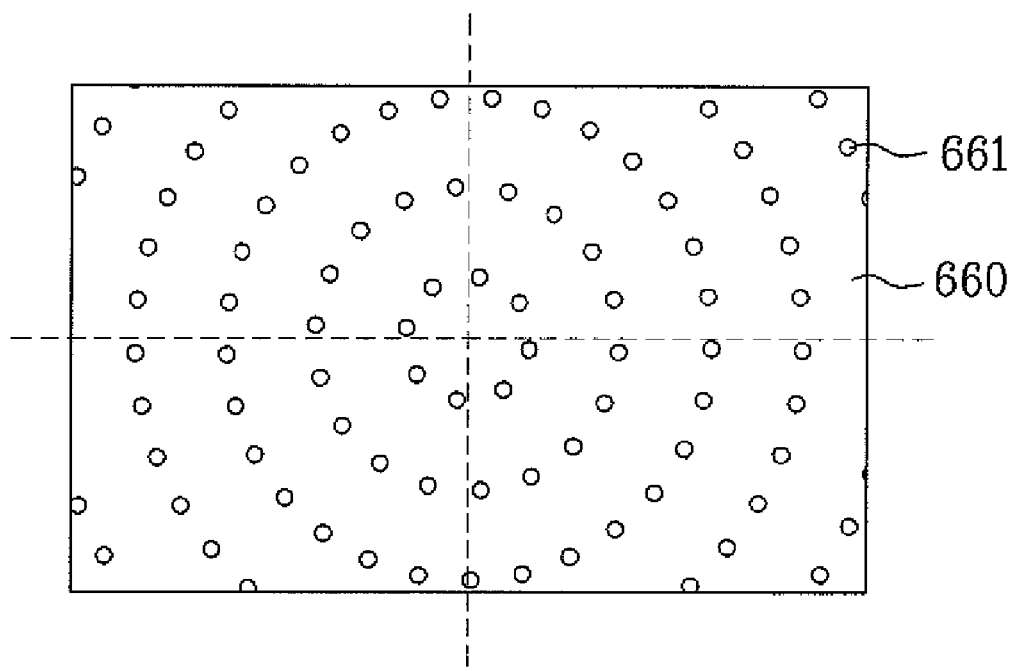

On the other hand, as shown in FIG. 62, the holes 661 may be arranged to form a plurality of concentric circle patterns or radial patterns.

In addition, the holes 661 may have various polygonal patterns such as hexagonal patterns or octagonal patterns, or trapezoidal patterns. Also, an irregular pattern may be formed.

After the formation of the hole 661 in the dielectric layer 660 arranged on the n-type semiconductor layer 621, etching is carried out for the n-type semiconductor layer 621 in accordance with a dry etching process, to form a plurality of grooves 624, as shown in FIG. 58.

Thus, the dielectric layer 660 formed over the n-type semiconductor layer 621 functions as a mask or a passivation film for etching the n-type semiconductor layer 621.

In this case, the grooves 624 are formed to have the same pattern as the holes 661.

Figure 63:
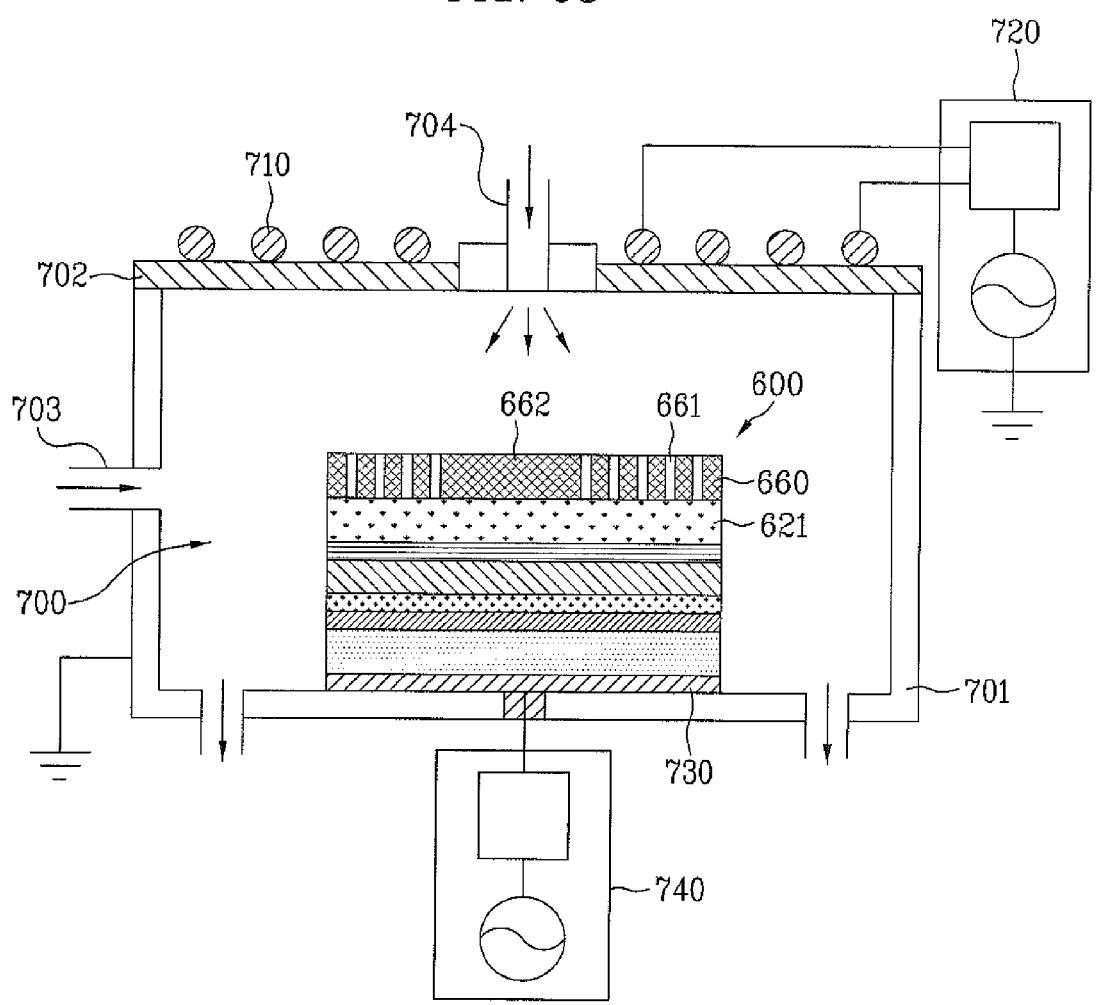

That is, the grooves 624 may be formed to have a pattern such as a square pattern, a plurality of oblique-line patterns, a plurality of oblique-line patterns divided into at least two regions, a plurality of oblique-line patterns divided into at least two regions while extending in opposite directions, a plurality of concentric patterns, polygonal patterns, trapezoidal patterns, or radial patterns FIG. 63 illustrates a procedure for forming the grooves 624 in the n-type semiconductor layer 621, using an ICP-RIE apparatus.

For the ICP-RIE apparatus, a planar type or a solenoid type may be used. In FIG. 63, a planar type ICP-RIE apparatus is illustrated.

In the ICP-RIE apparatus, a copper coil 710 is arranged on a chamber 700 including a grounded metal shield 701 and an insulating window 702 covering the metal shield 701. Electric power from a radio-frequency (RF) power supplier 720 is applied to the coil 710. In this case, an electric field should be formed at an appropriate angle, in order to insulate the insulating window 702 by the RF power.

The LED structure 600 formed with the dielectric layer 660 with the pattern of holes 661 is laid on a lower electrode 730 arranged in the chamber 700. The lower electrode 730 is connected to a bias voltage supplier 740 for supplying a bias voltage to bias the LED structure 600 such that desired etching is achieved.

The bias voltage supplier 740 preferably supplies RF power and a DC bias voltage.

A gas mixture including at least one of Ar, $BCl_3$, and $Cl_2$ is introduced into the chamber 700 through a reactive gas port 703. At this time, electrons are injected into the chamber 700 through a top port 704.

The injected electrons strike neutral particles of the introduced gas mixture due to an electromagnetic field generated by the coil 710, thereby generating ions and neutral atoms to produce plasma.

Figure 64:
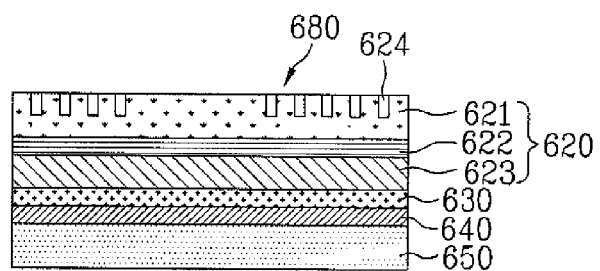

The ions in the plasma are accelerated to move toward the LED structure 600, by the bias voltage from the bias voltage supplier 740 supplied to the electrode 730. The accelerated ions pass through the pattern of the holes 661 of the dielectric layer 660, together with the accelerated electrons, thereby forming the pattern of the grooves 624 in the n-type semiconductor layer 621, as shown in FIG. 64.

In this case, the pressure of the chamber 700 is maintained at 5 mTorr. An He flow may also be used. Preferably, the chamber 700 is cooled to 10° C. during the etching procedure.

For the RF power supplier 720 and bias voltage supplier 740, electric power of 33 W and 230 W may be used, respectively.

For the formation of the holes 660 in the dielectric layer 661, the above-described ICP-RIE apparatus may also be used in the same manner as described above. In this case, the gas mixture may include at least one of $CF_4$, Ar, and $CHF_3$. The RF power supplier 720 and bias voltage supplier 740 may use electric power of 50 W and 300 W, respectively.

The holes 660 may be irregularly formed in the dielectric layer 661 in the above-described procedure, to irregularly form the grooves 624 in the n-type semiconductor layer 621. The irregular grooves 624 provide a rough surface, through which light is extracted, to achieve an enhancement in extraction efficiency.

However, it is preferred that the pattern of the grooves 624 be regular to have a certain periodicity (FIGS. 58 to 62), and thus, to form a photonic crystal structure 680 on the surface of the n-type semiconductor layer 621.

Figure 65:
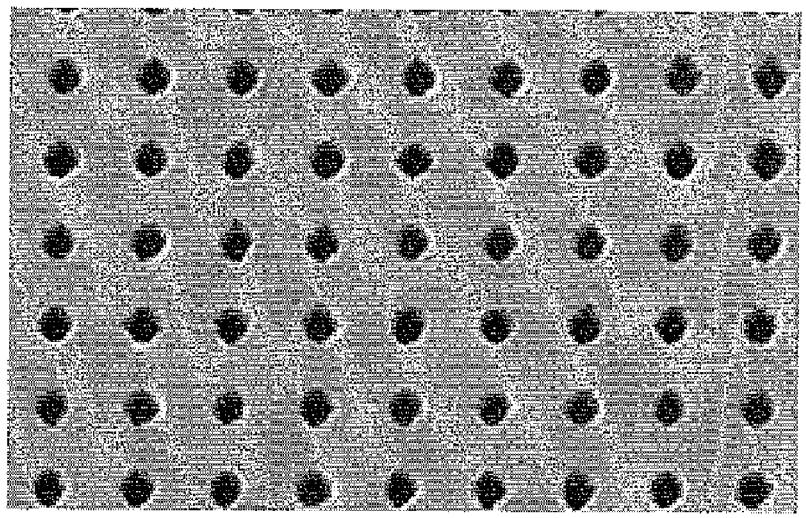

FIG. 65 illustrates a scanning electron microscope (SEM) image of the photonic crystal structure 680 formed on the n-type semiconductor layer 621 in accordance with the above-described procedures.

The photonic crystal structure 680 is formed such that the periodicity of a photonic crystal is 0.5 to 1.5 μm, and the diameter of the grooves 624 forming the photonic crystal corresponds to about 0.3 to 0.6 times the photonic crystal periodicity, taking into consideration the refractive index of GaN (2.6), the refractive index of an epoxy lens, which is included in the LED structure and from which light is extracted, (1.5), and the relation with a driving voltage.

The grooves 624 may have a depth corresponding to ⅓ or more of the thickness of the n-type semiconductor layer 621.

When the above-described photonic crystal structure 680 is formed, it has a periodic refractive index arrangement. When the periodicity of the photonic crystal structure 680 corresponds to about half of the wavelength of emitted light, a photonic band-gap is formed in accordance with multi-scattering of photons by a photonic crystal lattice having a periodic variation in refractive index.

In the photonic crystal structure 680, light has a property of effective emission in a certain direction. That is, a light prohibition zone is formed. Accordingly, there may be a phenomenon that light is extracted through regions other than the holes 624 forming the phonic crystal structure 680 without entering or passing through the holes 624.

Figure 66:
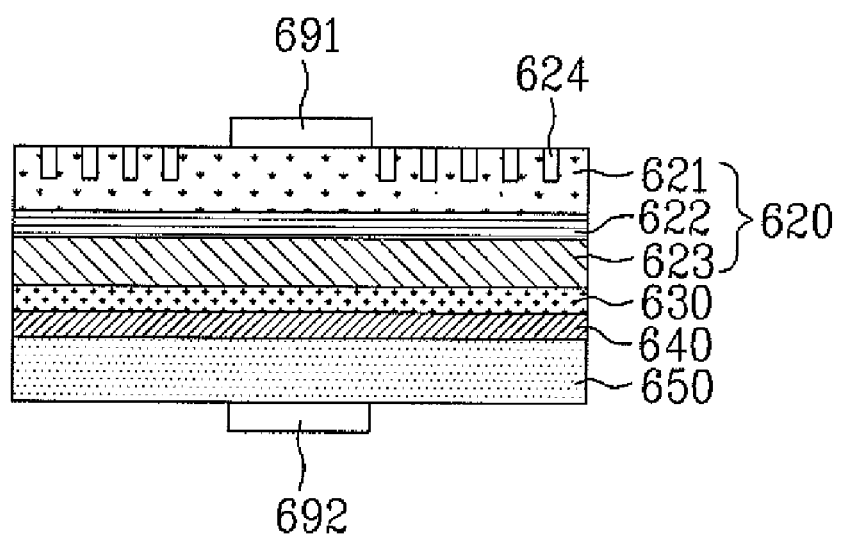

As described above, the n-type electrode pads 691 and p-type electrode pads 692 are formed at upper and lower surfaces of the LED structure 600 formed with the photonic crystal structure 680, as shown in FIG. 66. Thus, the LED structure 600 is completely manufactured.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device comprising:
a conductive support structure;
a first electrode over the conductive support structure;
a semiconductor layer over the first electrode;
a light extracting structure arranged over the semiconductor layer; and
a second electrode over the semiconductor layer,
wherein the light extracting structure has a plurality of holes or grooves,
wherein a transparent material that is different from a material of the light extracting structure is located in the holes or grooves,
and wherein the refractive index of the light extracting structure is greater or less than the refractive index of the transparent material.

2. The light emitting device according to claim 1, wherein the plurality of holes or grooves are regularly distributed.

3. The light emitting device according to claim 1, further comprising:
a transparent conducting layer between the light extracting structure and the semiconductor layer.

4. The light emitting device according to claim 3, wherein the transparent conducting layer has a thickness of $\lambda/16n$ to $\lambda/2n$ (where "$\lambda$" represents a wavelength of emitted light and "n" represents a refractive index of the transparent conducting layer).

5. The light emitting device according to claim 1, further comprising:
a transparent metal layer between the light extracting structure and the semiconductor layer.

6. The light emitting device according to claim 5, wherein the transparent metal layer comprises Ni and/or Au, or an alloy containing Ni and Au.

7. The light emitting device according to claim 1, wherein the light extracting structure comprises an oxide or a nitride.

8. The light emitting device according to claim 1, wherein the refractive index of the light extracting structure is 2.4 or more.

9. The light emitting device according to claim 1, wherein the light extracting structure comprises SiN or $TiO_2$.

10. The light emitting device according to claim 1, wherein the semiconductor layer comprises:
an n-type semiconductor layer;
an active layer arranged on the n-type semiconductor layer; and
a p-type semiconductor layer arranged on the active layer.

11. The light emitting device according to claim 10, wherein the p-type semiconductor layer has a thickness of 30 to 500 nm.

12. The light emitting device according to claim 1, wherein the light extracting structure comprises a dielectric layer.

13. The light emitting device according to claim 1, wherein the light extracting structure has a thickness of 150 nm or more.

14. The light emitting device according to claim 1, wherein the semiconductor layer comprises:
a p-type semiconductor layer;
an active layer arranged on the p-type semiconductor layer; and
an n-type semiconductor layer arranged on the active layer.

15. The light emitting device according to claim 1, wherein the first electrode comprises:
a reflective electrode; and
an ohmic electrode arranged on the reflective electrode.

16. The light emitting device according to claim 1, wherein the conductive support structure comprises a metal or a semiconductor.

17. The light emitting device according to claim 1, wherein the transparent material comprises an oxide.

18. The light emitting device according to claim 17, wherein the transparent material comprises a transparent conducting oxide.

19. The light emitting device according to claim 1, wherein the light extracting structure is formed on the semiconductor layer.

20. The light emitting device according to claim 1, wherein the light extracting structure is formed by etching the semiconductor layer.

21. The light emitting device according to claim 1, wherein the radius of hole or the groove is in the range of 0.1a to 0.45a, where "a" is an average distance between adjacent holes or grooves.

22. The light emitting device according to claim 1, wherein the average distance between adjacent holes or grooves is in the range of 200nm to 5,000 nm.

23. The light emitting device according to claim 22, wherein the depth of the hole or the groove is in the range of $0.25\lambda/n$ to $10\lambda/n$, where "$\lambda$" represents the wavelength of emitted light and "n" represents the refractive index of the light extracting structure.

24. The light emitting device according to claim 22, wherein the holes or grooves have a depth configured to saturate the extraction efficiency of the light extracting structure.

* * * * *